United States Patent
Lee et al.

(10) Patent No.: US 8,653,578 B2
(45) Date of Patent: Feb. 18, 2014

(54) SEMICONDUCTOR DEVICE COMPRISING STRING STRUCTURES FORMED ON ACTIVE REGION

(75) Inventors: Changhyun Lee, Suwon-si (KR); Jungal Choi, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 297 days.

(21) Appl. No.: 12/555,830

(22) Filed: Sep. 9, 2009

(65) Prior Publication Data

US 2010/0072559 A1    Mar. 25, 2010

(30) Foreign Application Priority Data

Sep. 24, 2008 (KR) ......................... 10-2008-0093774

(51) Int. Cl.
*H01L 29/788* (2006.01)

(52) U.S. Cl.
USPC ........... 257/315; 257/314; 257/390; 257/393; 257/E21.645; 257/E21.662; 257/E29.129; 257/E29.3

(58) Field of Classification Search
CPC ............ H01L 27/115; H01L 27/11521; H01L 27/11524
USPC .................. 257/E21.662, 390, 315, 393, 314, 257/E29.3, E29.129, E21.645
See application file for complete search history.

(56) References Cited

U.S. PATENT DOCUMENTS

| | | | |
|---|---|---|---|
| 5,770,880 A * | 6/1998 | Woodbury et al. | 257/336 |
| 6,858,906 B2 | 2/2005 | Lee et al. | |
| 7,253,467 B2 | 8/2007 | Lee et al. | |
| 2006/0038218 A1 * | 2/2006 | Yaegashi et al. | 257/314 |
| 2006/0180851 A1 | 8/2006 | Lee et al. | |
| 2006/0220098 A1 | 10/2006 | Lee et al. | |
| 2007/0138576 A1 * | 6/2007 | Mizukami et al. | 257/390 |
| 2008/0135912 A1 * | 6/2008 | Lee et al. | 257/315 |

FOREIGN PATENT DOCUMENTS

| | | |
|---|---|---|
| GB | 2403096 A | 12/2004 |
| JP | 2000-068487 | 3/2000 |
| JP | 2003289368 A | 10/2003 |
| KR | 1020020062431 | 7/2002 |
| KR | 1020060105379 A | 10/2006 |
| KR | 100673020 B1 | 1/2007 |
| KR | 1020070002302 A | 1/2007 |

OTHER PUBLICATIONS

Samsung; "CMOS Image Sensor(CIS) Image Signal Processor", 20021101, No. Revision 0.0, Nov. 1, 2002, pp. 1-35.
Hynix, "CMOS image Sensor with Image Signal Processing", 20020429, vol. V1.0, No. Rev 2.0, Apr. 29, 2002, pp. 1-64.

* cited by examiner

*Primary Examiner* — Anthony Ho
*Assistant Examiner* — David Chen
(74) *Attorney, Agent, or Firm* — Volentine & Whitt, PLLC

(57) ABSTRACT

A semiconductor device having a string gate structure and a method of manufacturing the same suppress leakage current. The semiconductor device includes a selection gate and a memory gate. The channel region of the selection gate has a higher impurity concentration than that of the memory gate. Impurities may be implanted at different angles to form the channel regions having different impurity concentrations.

15 Claims, 27 Drawing Sheets

SEMICONDUCTOR DEVICE COMPRISING STRING STRUCTURES FORMED ON ACTIVE REGION

CROSS-REFERENCE TO RELATED APPLICATION

This U.S. non-provisional patent application claims priority under 35 U.S.C §119 to Korean Patent Application No. 10-2008-0093774, filed on Sep. 24, 2008, the entirety of which is herein incorporated by reference.

BACKGROUND OF THE INVENTIVE CONCEPT

1. Field of the Inventive Concept

The present inventive concept relates to semiconductor devices and to methods of manufacturing the same. More specifically, the present inventive concept relates to a semiconductor device having a string of gates including (string and ground) selection gates and a group memory gates interposed between the selection gates, and to a method of manufacturing the same.

2. Description of Related Art

A transistor, which is a unit of a semiconductor device, includes a gate electrode formed on a semiconductor substrate and source/drain regions formed in the semiconductor substrate at opposite sides of the gate electrode. A channel extending through the semiconductor substrate connects the source/drain regions across the gate electrode. The source/drain regions are doped with impurities of a conductivity type different from the conductivity type of the impurities of the semiconductor substrate. For example, in a transistor in which the semiconductor substrate contains N-type impurities, the source/drain regions are doped with P-type impurities.

The elements of such transistors are being scaled down to meet the growing demand for high-density semiconductor devices. In this respect, the length of the channel of the gate electrode is becoming smaller. However, a transistor having a small channel length is prone to what are known in the art as short-channel effects. These effects reduce the reliability of the semiconductor device.

SUMMARY OF THE INVENTIVE CONCEPT

Accordingly, an object of the present inventive concept is to provide a high-density semiconductor device that is capable of operating stably.

According to one aspect of the present invention, there is provided a semiconductor device with a ground selection gate and a string selection gate disposed on an active region of a substrate, memory gates disposed between the ground selection gate and the string selection gate, and wherein the channels of the selection gates have a higher concentration of impurities than the channel of at least one of the memory gates.

The active region is thus made up of selection channel regions below the ground selection gate and the string selection gate, respectively, and a memory cell region which is located beneath the memory gates and borders the selection channel regions so as to terminate at locations directly beneath sidewalls of the selection gates. The memory cell region is in turn made of memory channel regions below the memory gates, respectively. At least a portion of each of the selection channel regions has a higher concentration of an impurity than at least one of the memory channel regions.

The memory cell region is also made up of memory impurity regions at opposite sides of each of the memory channel regions. The aforementioned at least one of the memory channel regions and the unit memory impurity regions adjacent thereto may have the same conductivity type.

According to another aspect of the inventive concept, there is provided a method of fabricating a semiconductor device comprising forming a pair of selection gates and a group of memory gates between the selection gates on the active region of a substrate, and doping the active region in such a way and in such a sequence relative to the forming of the gates as to produce doped selection regions below the selection gates in which the doped selection regions have a higher concentration of impurities than in the active region below the memory gates. Also, the doping is carried out such that the doped selection regions, and those portions of the active region adjacent to opposite sides of at least one of the memory gates, are of the same conductivity type as the active region below the memory gates.

According to another aspect of the inventive concept, there is provided a method of fabricating a semiconductor device comprising selectively forming impurity-implanted regions in an active region having impurities at a first impurity concentration, and forming a ground selection gate, a string selection gate, and memory gates on the active region. The gates are formed so that memory gates are disposed between the ground selection gate and the string selection gate. Also, the ground selection gate and the string selection gate are disposed on the impurity-implanted regions, respectively. The impurity-implanted regions have a concentration of impurities greater than the first impurity concentration. Also, the active region between the ground selection gate and the string selection gate has the first impurity concentration, and the impurities of the first impurity concentration and the second impurity concentration are of the same conductivity type

DETAILED DESCRIPTION OF THE PREFERRED EMBODIMENTS

Figure 1:
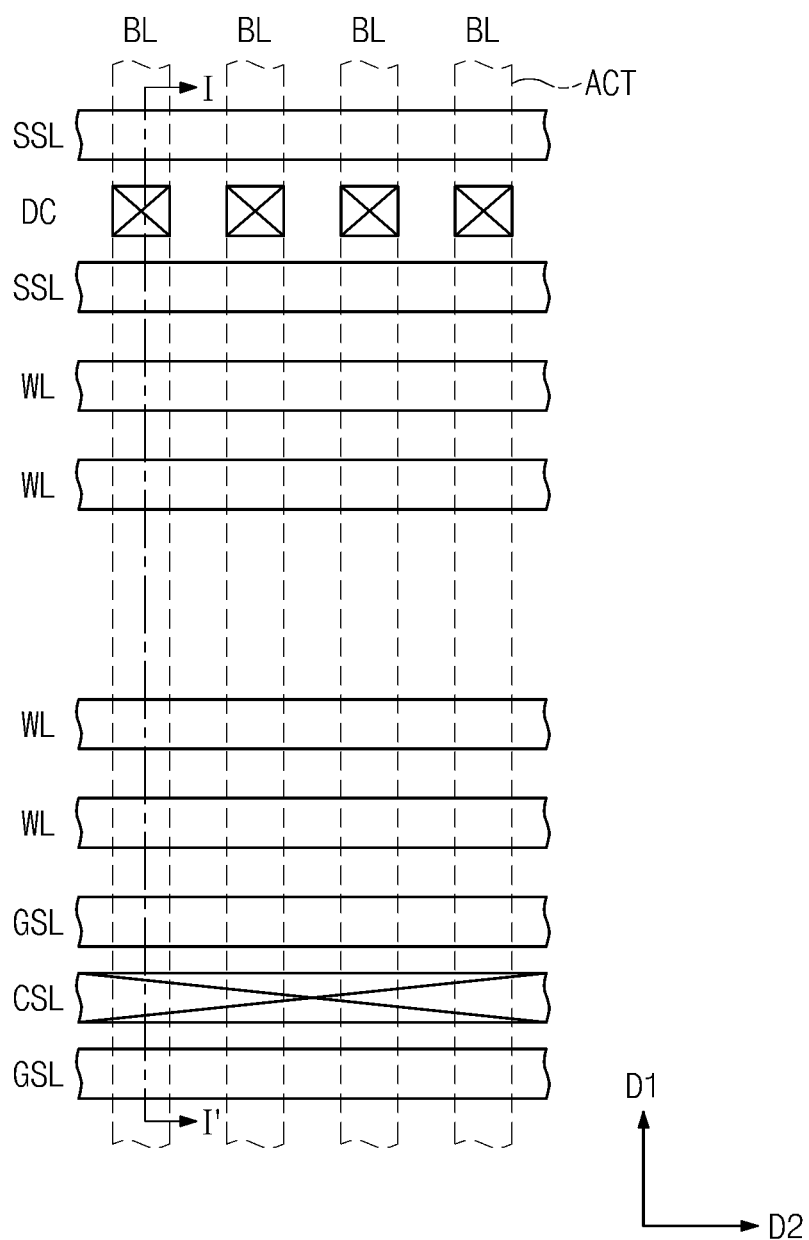
FIG. 1 is a plan view of a semiconductor device according to the present invention.

The present inventive concept will now be described more fully hereinafter with reference to the accompanying drawings. Like numbers designate like elements throughout the drawings. Thus, detailed descriptions of elements of a semiconductor device which are similar to those already described in connection with a previous embodiment, and which elements are designated by like reference numerals, may be omitted for the sake of brevity. The same goes for the process or processes of fabricating such elements. Also, the dimensions of layers and regions may be exaggerated in the drawings for ease of illustration.

A first embodiment of a semiconductor device according to the present inventive concept will now be described below in detail with reference to FIGS. 1 and 2.

A semiconductor device according to the present inventive concept has a substrate 10 in which active regions ACT are provided, and at least one string of gates disposed in a first direction D1 across each active region ACT of the substrate 110. The string of gates includes a pair of selection gates and a group of memory gates MG memory gates interposed between the selection gates. The pair of selection gates includes a ground selection gate GSG and a string selection gate SSG. Spacers (not shown) may be disposed on sidewalls of the gates GSG, SSG, and MG.

The memory gates MG comprise a first memory insulating layer 141, a first memory gate layer 143, a second memory insulating layer 145, and a second memory gate layer 147. The first memory gate layer 143 is a charge storage layer such as a floating-type storage layer or a trap-type storage layer.

Preferably, the second memory insulating layer 145 includes a film of material selected from the group consisting of silicon oxide ($Si_xO_y$), aluminum oxide ($Al_xO_y$), tantalum oxide ($Ta_xO_y$), hafnium oxide ($HfO_2$), hafnium aluminum oxide (HfAlO), and hafnium silicon oxide (HfSiO). Furthermore, the second memory insulating layer 145 may be formed of a plurality of films of material, as disclosed in U.S. Patent Publication No. 2006/0180851, the entirety of which is hereby incorporated by reference. Also, the dielectric constant of the second memory insulating layer 145 may be greater than that of the first memory insulating layer 141 as disclosed in U.S. Pat. No. 6,858,906 the entirety of which is also hereby incorporated by reference.

The second memory gate layer 147 may have a work function of at least 4 eV as disclosed in U.S. Pat. No. 7,253,467 the entirety of which is also hereby incorporated by reference.

The ground selection gate GSG includes a first ground insulating layer 131, a first ground gate layer 133, a second ground insulating layer 135, and a second ground gate layer 137 electrically connected to the first ground gate layer 133. The string selection gate SSG includes a first string insulating layer 151, a first string gate layer 153, a second string insulating layer 155, and a second string gate layer 157 electrically connected to the first string gate layer 153. Alternatively, the ground selection gate GSG has only one ground insulating layer and ground gate layer, and the string selection gate SSG has only one string insulating layer and string gate layer.

In the present embodiment, the second ground gate layer 137 of the ground selection gate GSG extends in a second direction D2, running at an angle relative to the first direction D1, so as to constitute a ground selection line GSL. The second string gate layer 157 of the string selection gate SSG extends in the second direction D2 to constitute a string selection line SSL. The second memory gate layers 147 of the memory gates MG extend in the second direction D2 to constitute wordlines WL.

In the present embodiment, each active region ACT in the semiconductor substrate 110 comprises a well having regions 112 in which impurities are implanted. The impurity-implanted regions 112 are located below and between the ground selection gate GSG and the adjacent ground selection gate GSG', and below and between the string selection gate SSG and the adjacent string selection gate SSG', respectively.

More specifically, impurities are implanted into selection channel regions 116, selection impurity regions 117, and a memory cell region 118 of the substrate.

The selection channel regions 116 are those regions (in the well) below and bounded between the sides of each of the ground selection gate GSG and the string selection gate SSG, respectively. The memory cell region 118 is that region which extends (in the well) between the ground selection gate GSG and the string selection gate SSG. Furthermore, the selection impurity regions 117 are those regions (in the well) between the ground selection gate GSG and an adjacent ground selection gate GSG' and between the string selection gate SSG and an adjacent string selection gate SSG', respectively.

The selection channel regions 116 and the memory cell region 118 have the same conductivity type, and at least a portion of each of the selection channel regions 116 contains a higher concentration of impurities than the memory cell region 118. Thus, each of the selection channel regions 116 contains a higher concentration of impurities than the channel regions beneath the memory gates MG including those closest to the selection channel regions 116 in the string.

A method of manufacturing a semiconductor device of FIG. 2 according to the present inventive concept will now be described below in detail with reference to FIGS. 1 through 4.

Figure 3:
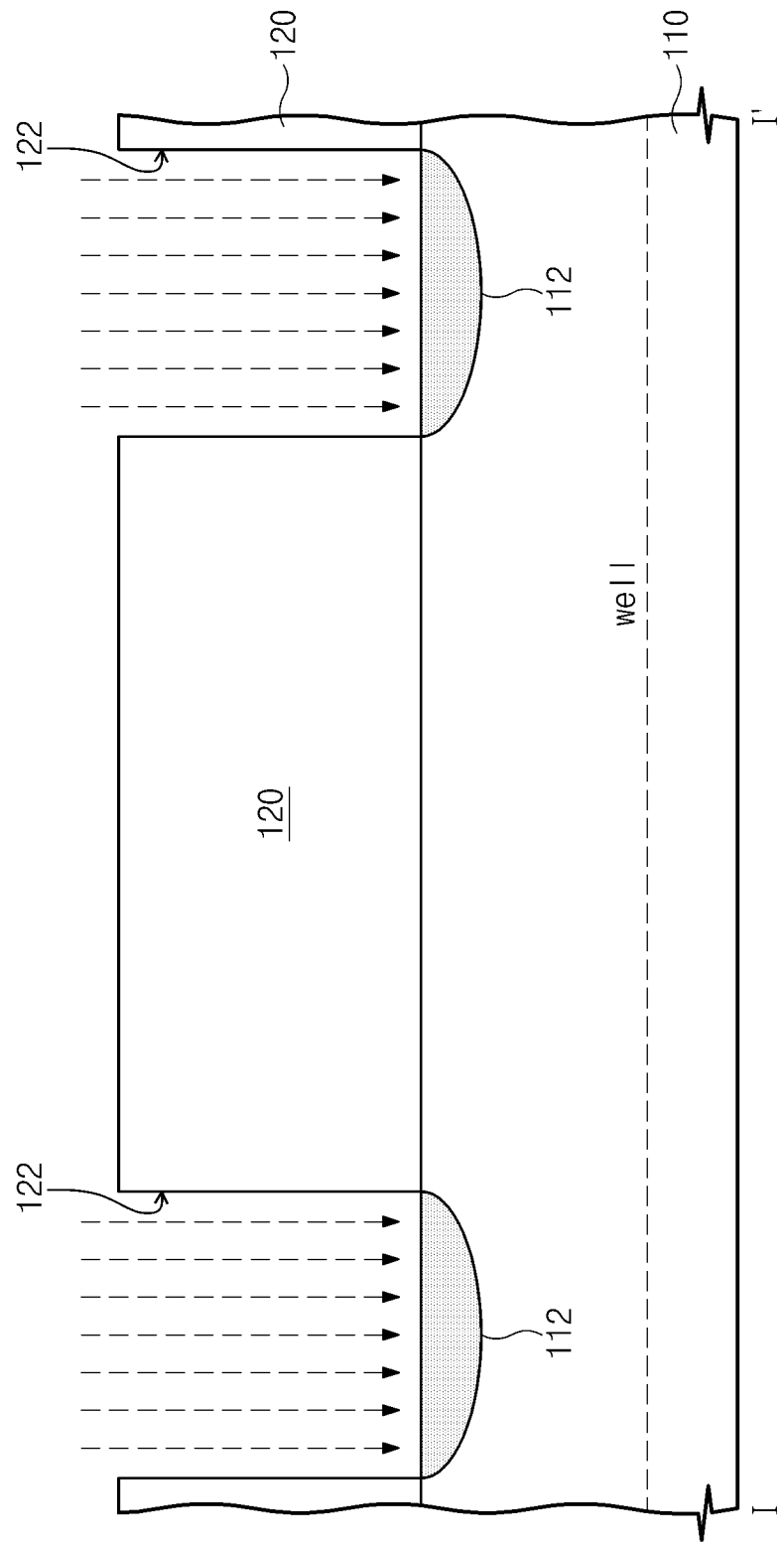

Referring first to FIGS. 1 and 3, a device isolation layer (not shown) is formed on a substrate 110 to define an active region ACT extending longitudinally in a first direction D1. An upper portion of the active region ACT, e.g., a well, contains impurities at a first concentration.

An impurity implanting mask 120 is formed on the substrate 110 including over the active region ACT. The impurity implanting mask 120 has openings 122 that expose regions to be implanted. The impurity implanting mask 120 comprises an insulating material such as a photoresist, silicon nitride or silicon oxide.

Impurities are implanted into the active region ACT of the substrate 110 using the impurity implanting mask 120. At this time, impurity-implanted regions 112 are formed in those parts of the active region ACT exposed by the openings 122. The concentration of impurities in the implanted regions 112 is higher than the concentration of impurities in the other portions of the active region ACT but the impurity-implanted regions 112 are of the same conductivity type as the other portions of the active region ACT.

Figure 4:
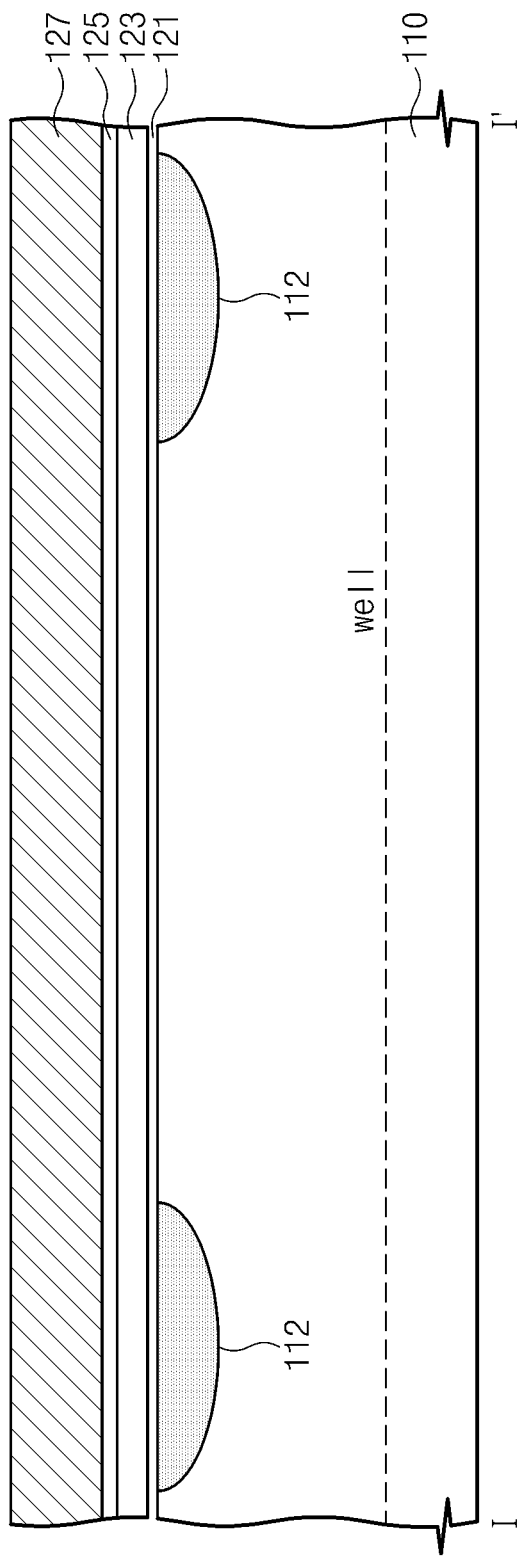

Referring to FIG. 4, the impurity implanting mask 120 is removed. A first insulating layer 121, a first gate layer 123, a second insulating layer 125, and a second gate layer 127 are then formed on the substrate 110. The first insulating layer 121 may comprise silicon oxide, and the second insulating layer 125 may comprise a film of silicon oxide and/or a film of silicon nitride. Preferably, the second insulating layer 125 includes a high-k dielectric material. The first gate layer 123 may comprise conductive polysilicon. Alternatively, the first gate layer 123 comprises a layer of high-k dielectric material. The second gate layer 127 preferably comprises one or more films selected from the group consisting of conductive polysilicon, metal, metal silicide and conductive metal nitride.

Figure 2:
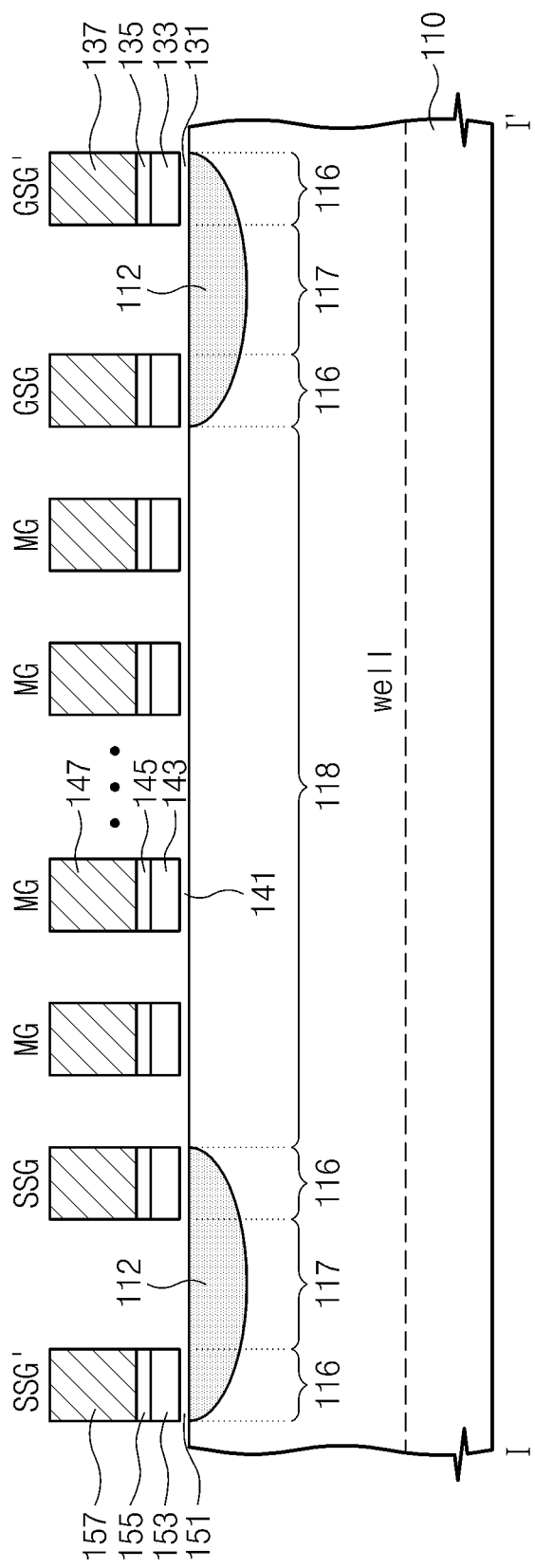
FIGS. 2 through 4 are cross-sectional views illustrating a semiconductor device according to some embodiments of the present inventive concept and a method of manufacturing the same.

Before the second gate layer 127 is formed, a butting region (not shown) may be formed by selectively etching the second insulating layer 125 to form (butting) openings that expose the first gate layer 123 at the regions where the ground selection gate GSG and the string selection gate (SSG) are to be formed (refer to FIG. 2). Then, the (butting) openings are filled when the second gate layer 127 is formed on the second insulating layer 125. As a result, the second gate layer 127 contacts (i.e., is stacked directly on) the first gate layer 123 at the regions where the ground selection gate GSG and the string selection gate SSG are to be formed.

Then, the layers 121, 123, 125 and 127 are etched to form at least a pair of selection gates, including a ground selection gate GSG and a string selection gate SSG, and a set of memory gates MG therebetween on the substrate 110. In addition, a common source line CSL may be formed between the ground selection gate GSG and an adjacent ground selection gate GSG'. Also, a DC plug may be formed between the string selection gate SSG and an adjacent string selection gate SSG' as electrically connected to a bitline BL.

Figure 5:
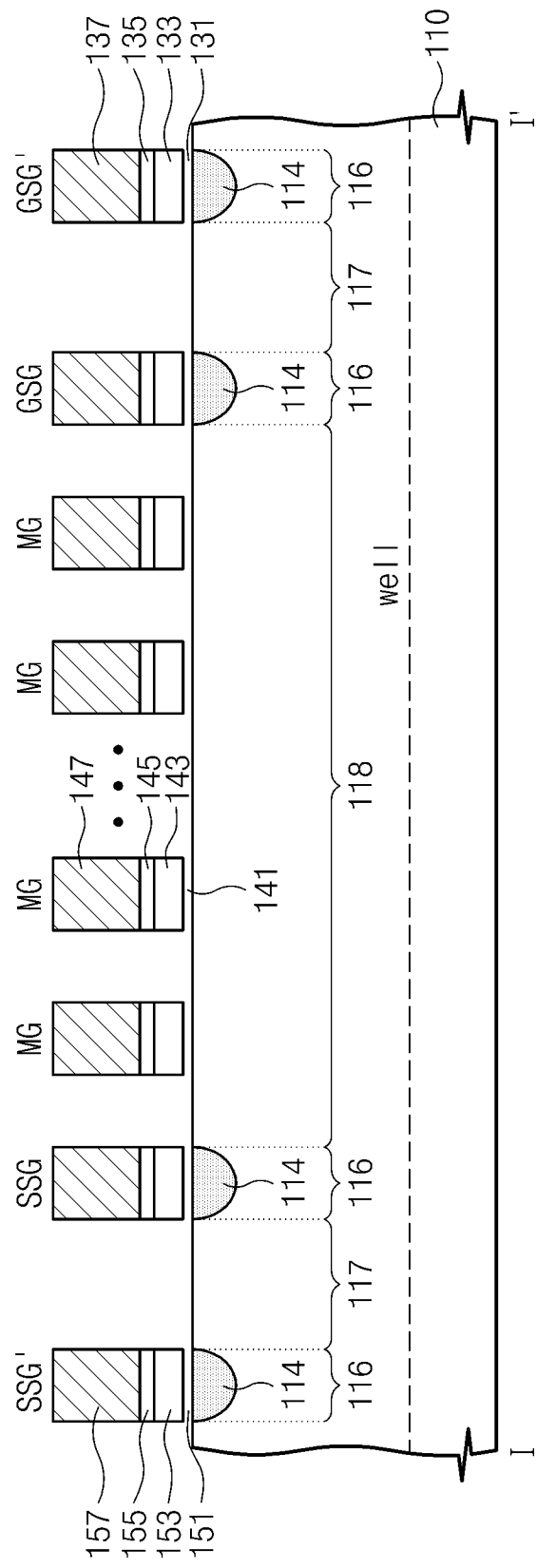
FIGS. 5 through 7 are cross-sectional views illustrating a semiconductor device according to other embodiments of the present inventive concept and a method of manufacturing the same.

Another embodiment of a semiconductor device according to the present inventive concept will now be described below in detail with reference to FIGS. 1 and 5.

A ground selection gate GSG and a string selection gate SSG, and memory gates MG interposed therebetween, are disposed on a substrate 110 having an active region ACT. The gates GSG, SSG, and MG are similar to those described above in connection with the embodiment of FIG. 2.

Selection channel regions 116 are defined (in the well) in the substrate below the ground selection gate GSG and the string selection gate SSG, respectively, and a memory cell region 118 extends (in the well) in the substrate between the ground selection gate GSG and the string selection gate SSG. Furthermore, selection impurity regions 117 extend (in the well) in the substrate between the ground selection gate GSG and an adjacent ground selection gate GSG' and between the string selection gate SSG and an adjacent string selection gate SSG', respectively.

The selection channel region 116 and the memory cell region 118 are of the same conductivity type, but the concentration of impurities in at least a portion of the selection channel regions 116 is higher than the concentration of impurities in the memory cell region 118. To this end, as will be described below, the channel regions 116 may be formed as impurity-implanted regions 114 of the substrate.

A method of manufacturing the semiconductor device of FIG. 5 according to the present inventive concept will now be described below in detail with reference to FIG. 1 and FIGS. 5 through 7.

Figure 6:
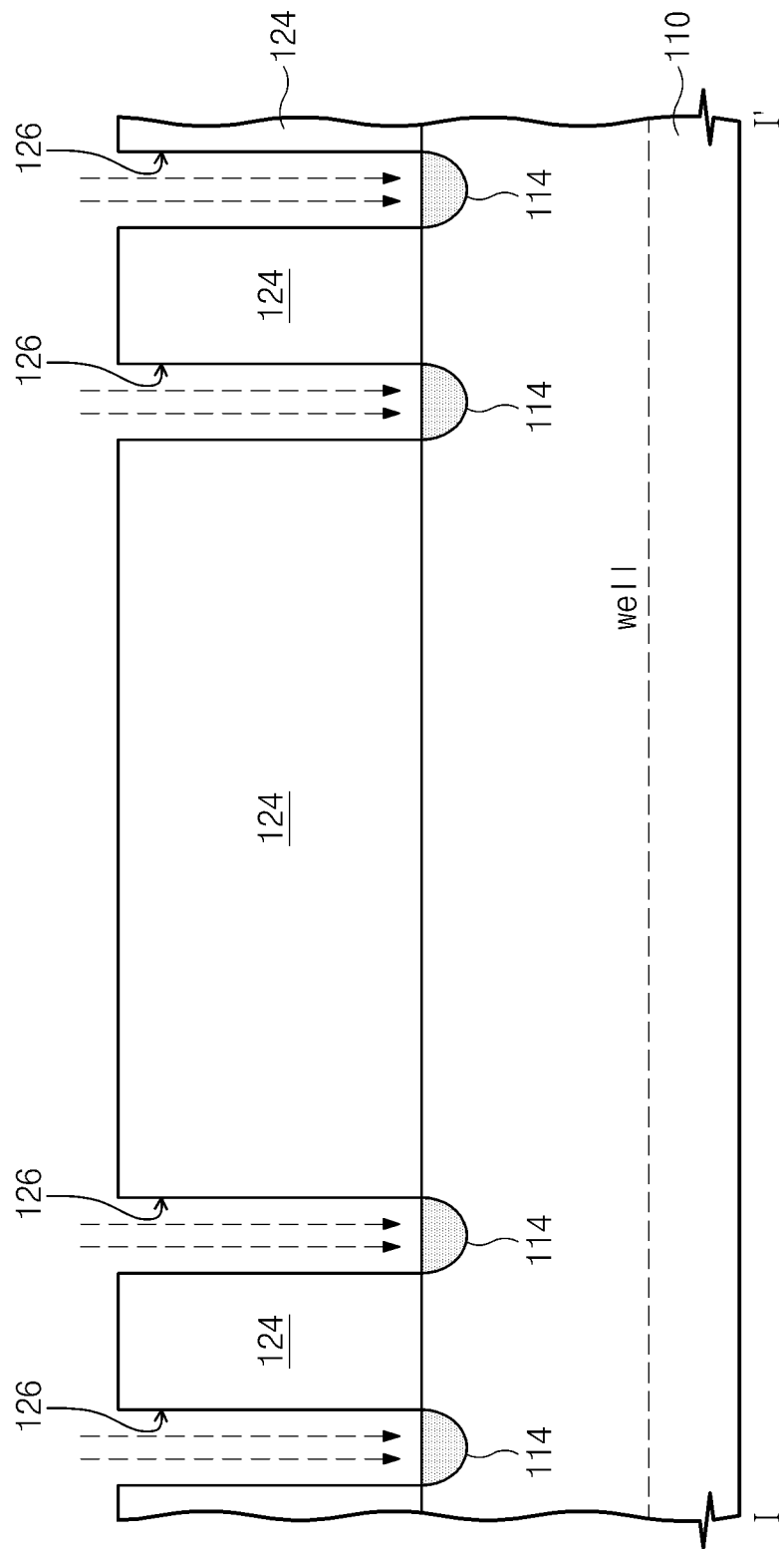

Referring to FIG. 6, an impurity implanting mask 124 is formed on a substrate 110 including over the active region ACT having impurities at a first concentration. The impurity implanting mask 124 has openings 126 exposing the substrate 110. In particular, the openings 126 expose locations on the active region where ground selection gates (GSG and GSG') and string selection gates (SGS and SGS') are to be formed (FIG. 5). The impurity implanting mask 124 is of an insulating material such as a photoresist, silicon nitride or silicon oxide.

Impurities are implanted into the active region of the substrate 110 using the impurity implanting mask 124. At this time, impurity-implanted regions 114 are formed in those parts of the active region exposed by the openings 126.

The concentration of the impurities in the impurity-implanted regions 114 is higher than the concentration of impurities in other portions of the active region ACT, but the impurity-implanted region 114 has the same conductivity type as the other portions of the active region ACT.

The impurity implanting mask 124 is then removed. Then, a ground selection gate GSG and a string selection gate SSG and memory gates MG are formed on the substrate 110. The gates GSG, SSG, and MG are formed similarly to those described above in connection with the embodiment of FIGS. 1-4.

Figure 7:
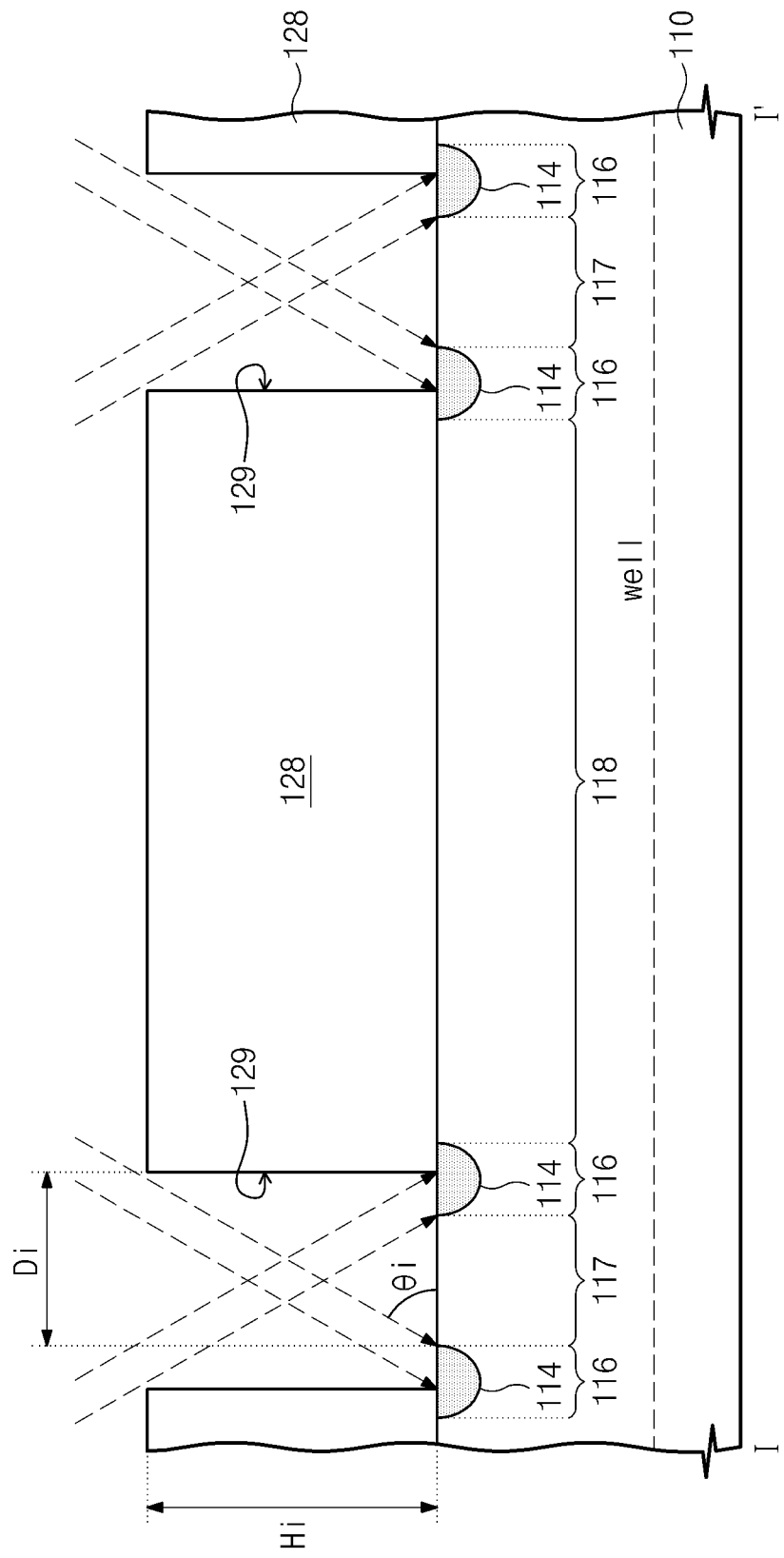

Alternatively, referring to FIG. 7, an impurity implanting mask 128 is formed on the substrate 110. The impurity implanting mask 128 has openings 129 that expose portions of the active region of the substrate, and the impurity implanting mask 128 covers locations corresponding to the memory cell region 118 and portions of the selection channel regions 116 that border the memory cell region 118. Thus, the openings 129 expose locations corresponding to the selection impurity regions 117 and portions of the selection channel regions 116 that border each of the selection channel regions 117.

Impurities are implanted into the active region using the impurity implanting mask 128 as an ion implantation mask. The impurities are implanted at an implantation angle θi relative to the upper surface of the substrate 110 and so as to have a concentration (second concentration) greater than the concentration (first concentration) of impurities in the other portions of the substrate. The implantation angle θi may be selected based on the height (Hi) of the impurity implanting mask 128 and the difference (Di) between the width of the opening 129 in the impurity implanting mask 128 and the desired width of the region over which impurities are to be implanted in the portion of the substrate 110 exposed by the opening 129. Thus, the implantation angle θi can be expressed as: $\tan^{-1}(Hi/Di)$. As a result, an impurity-implanted region 114 is formed in only a portion of the active region ACT exposed by the opening 129. Also, due to the implantation angle θi, the impurity-implanted region 114 extends below the impurity implanting mask 128. That is, the selection channel regions 116 have the second impurity concentration. The second impurity concentration is higher than the first impurity concentration, but the impurity-implanted regions 114 are of the same conductivity type as the other portions of the active region ACT below the impurity implanting mask 128.

Another embodiment of a semiconductor device according to the present inventive concept will now be described below in detail with reference to FIGS. 1 and 8.

A string of gates is disposed on an active region ACT of a semiconductor substrate 110. The gates include a ground selection gate GSG, a string selection gate SSG, and memory gates MG interposed therebetween on the substrate 110. The gates GSG, SSG, and MG are similar to those described above in the embodiments of FIGS. 2 and 5. Also, the substrate 110 has a well constituting the active region ACT, and in the well there are provided selection channel regions 116, selection impurity regions 117, and a memory cell region 118 as described above.

The selection channel regions 116, the selection impurity regions 117, and the memory cell region 118 have the same conductivity type. Also, at least a portion of each of the selection channel regions 116 has a higher concentration of impurities than the memory cell region 118.

In particular, a respective impurity-implanted region 119 having a higher concentration of impurities than the other parts of the active region ACT is disposed below each of the sidewalls of the selection gates GSG and GSG" that face each other, and the sidewalls of the selection gates SSG' and SSG' that face each other. That is, each of the impurity-implanted regions 119 is spread over a selection channel region 116 and a selection impurity region 117.

A method of manufacturing the semiconductor device of FIG. 8 according to the present inventive concept will now be described below in detail with reference to FIG. 1 and FIGS. 8 through 10.

Figure 8:
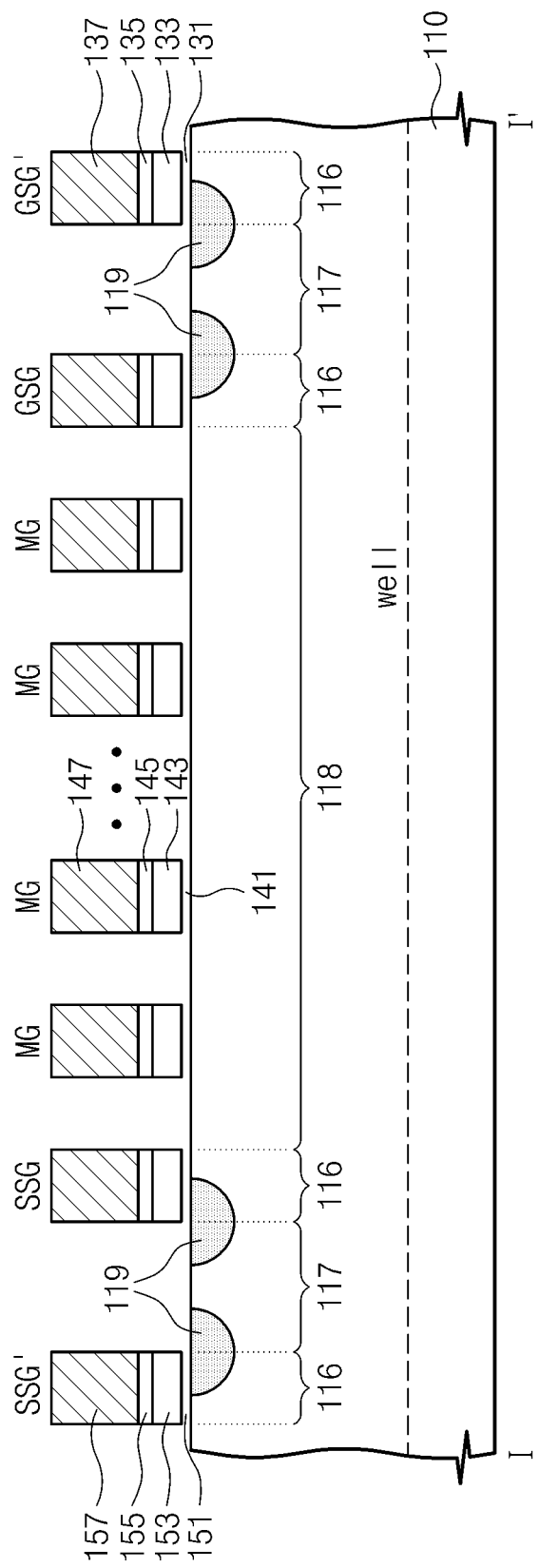
FIGS. 8 through 10 are cross-sectional views illustrating a semiconductor device according to other embodiments of the present inventive concept and a method of manufacturing the same.
Figure 9:
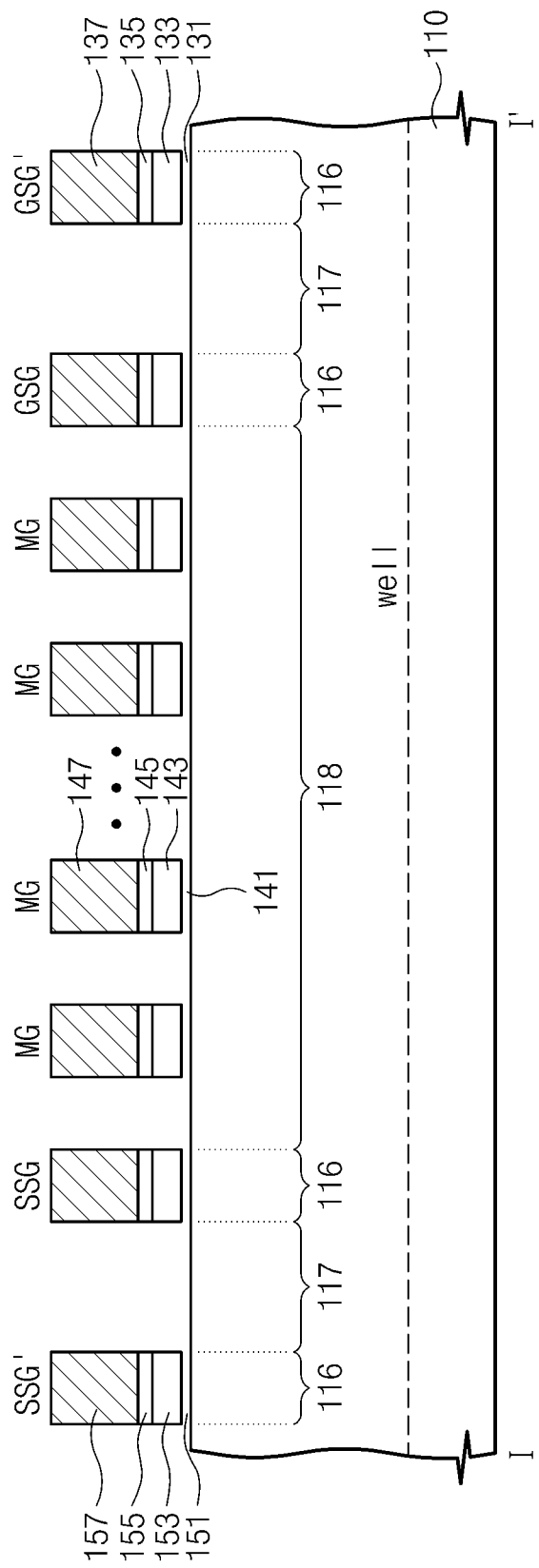

Referring to FIGS. 1, 8 and 9, at least a pair of selection gates including a ground selection gate GSG and a string selection gate SSG, and memory gates MG are formed on an active region of a substrate 110. The gates are formed as described above in connection with the previous embodiments. As was also described above, the gates demarcate selection channel regions 116, selection impurity regions 117 and a memory region 118.

Figure 10:
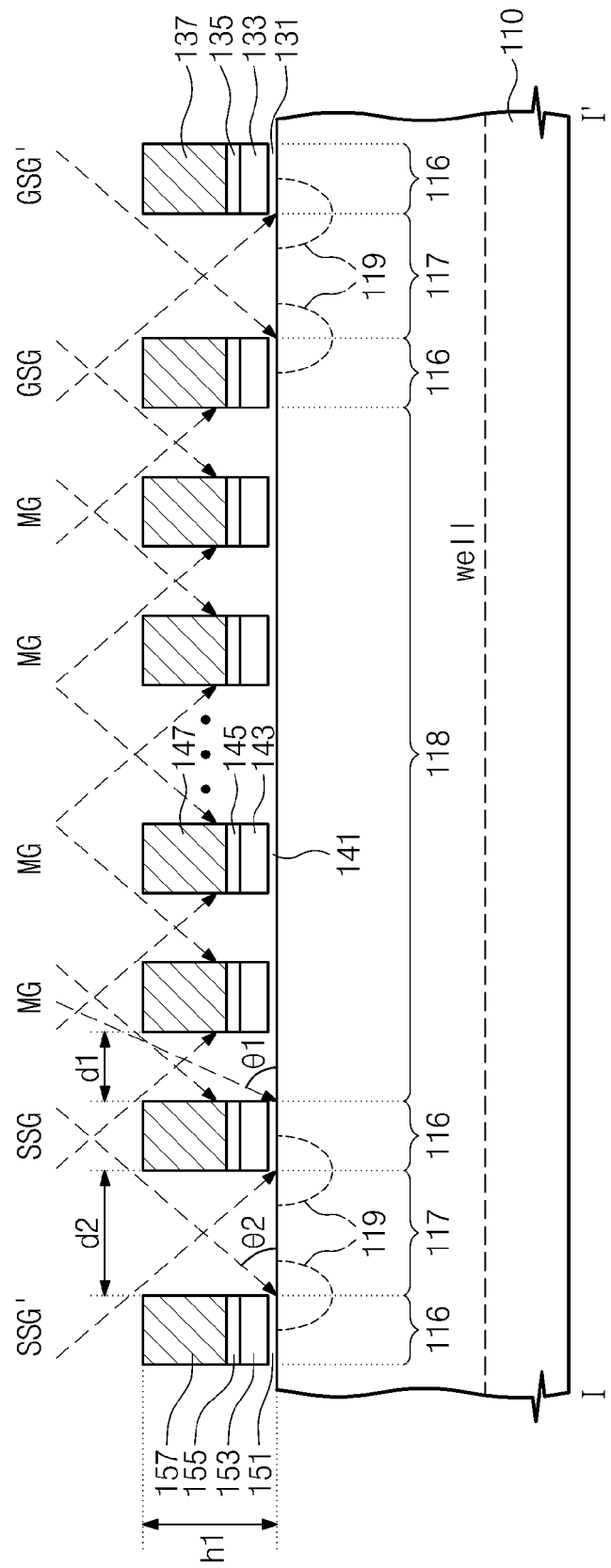

Referring to FIG. 10, impurities are implanted by an ion implantation process and more specifically, by an oblique ion implantation process, into the active region using the gates GSG, SSG, and MG as an ion implantation mask. The oblique ion implantation process implants impurities into the substrate at a predetermined implantation angle $\theta_i$ such that impurity implanted regions 119 are formed in the active region of the substrate 110. One impurity implanted region 119 extends below one side portion of the ground selection gate GSG and into part of the substrate adjacent to the ground selection gate GSG, and another impurity implanted region 119 extends below one side portion of the string selection gate SSG and into part of the substrate adjacent to the string selection gate SSG. In particular, impurities are selectively implanted into the active region at the boundaries between the impurity-implanted regions 117 and the selection channel regions 116. At this time, impurities are not implanted into the active region between the memory gates MG, between the set of memory gates MG and the ground selection gate GSG, and between the set of memory gate MG and the string selection gate SSG. The implantation angle $\theta_i$ is smaller than a first angle $\theta_1$ and greater than a second angle $\theta_2$ (i.e., $\theta_2 < \theta_i < \theta_1$).

The first angle $\theta_1$ is based on the distance d1 between an a pair of adjacent gates including a memory gate MG and the a selection gate GSG or SSG, and the height h1 of the structure used as a mask during the implantation process, namely, the height of the selection gates. In particular, the first angle $\theta_1$ may be the minimum angle at which the impurities can be implanted into the active region between the memory gate MG and the adjacent selection gate GSG or SSG.

The second angle $\theta_2$ is based on the distance d2 between the adjacent string selection gates SSG and SSG' (or the adjacent ground selection gates GSG GSG') and the height h1. In particular, the second angle $\theta_2$ is the minimum angle at which the impurities can be implanted into the active region between the adjacent string selection gates SSG and SSG' (or the adjacent ground selection gates GSG GSG').

Alternatively, an impurity implanting mask (not shown) may be formed to cover the substrate 110 between the selection gates GSG and SSG during the ion implantation process. In this case, the active region between the adjacent ground selection gates GSG and GSG' is exposed by the impurity implanting mask. The impurities are implanted into the exposed region of the substrate 110 at an implantation angle $\theta_i$ greater than the second angle $\theta_2$ and less than 90 degrees (i.e., $\theta_2 < \theta_i < 90°$). The impurity implanting mask may be a patterned layer of photoresist or spacers formed on sidewalls of the gates GSG, SSG, and MG. Such an impurity implanting mask is disclosed in U.S. Patent Publication No. 2006/0220098, the entirety of which is hereby incorporated by reference.

In any case, the impurity-implanted regions 119 are formed at the boundary between the selection channel regions 116 and the selection impurity regions 117. That is, impurities at a higher concentration than in the other portions of the active region below the string may be locally implanted in the selection channel region 116.

Then, an annealing process may be performed to expand the impurity-implanted regions 119 (as shown in FIG. 8).

Another embodiment of a semiconductor device according to the present inventive concept will be described below in detail with reference to FIGS. 1 and 11.

This embodiment is similar to that of FIG. 8 except that a first doping region 111 extends along the upper portion of the active region ACT including through the selection channel regions 116, the selection impurity region 117, and the memory cell region 118. The impurity-implanted regions 119 are thus second doping regions and have the same conductivity type as the first doping region 111; however, the concentration of impurities in the impurity-implanted regions 119 (second doping regions) is higher than in the first doping region 111. Thus, the concentration of impurities in at least a portion of each of the selection channel regions 116 (which portion is referred to as a selection doping region) is higher than in the memory cell region 118.

A method of manufacturing the semiconductor device of FIG. 11 according to the present inventive concept will now be described below in detail with reference to FIG. 1 and FIGS. 11 through 14.

Figure 12:
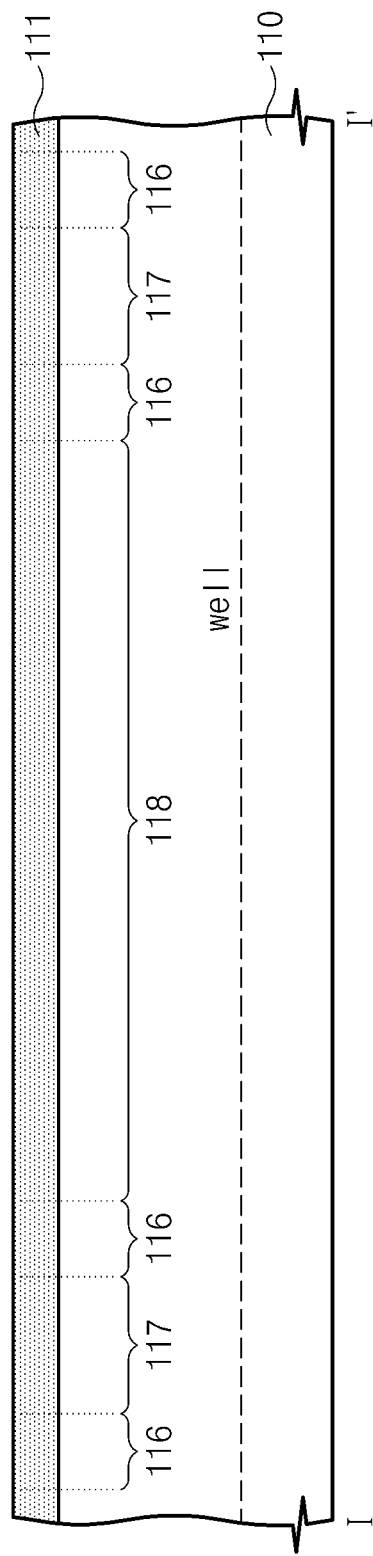

Referring to FIGS. 1 and 12, a first impurity implanting process is performed to implant impurities at a first concentration into an active region of a substrate 110. As a result, a first doping region 111 is formed in the well at the upper surface of the active region ACT of the substrate 110. Thus, the selection channel regions 116, the selection impurity regions 117, and the memory cell region 118 each will initially have a layer of impurities at the first concentration.

Figure 13:
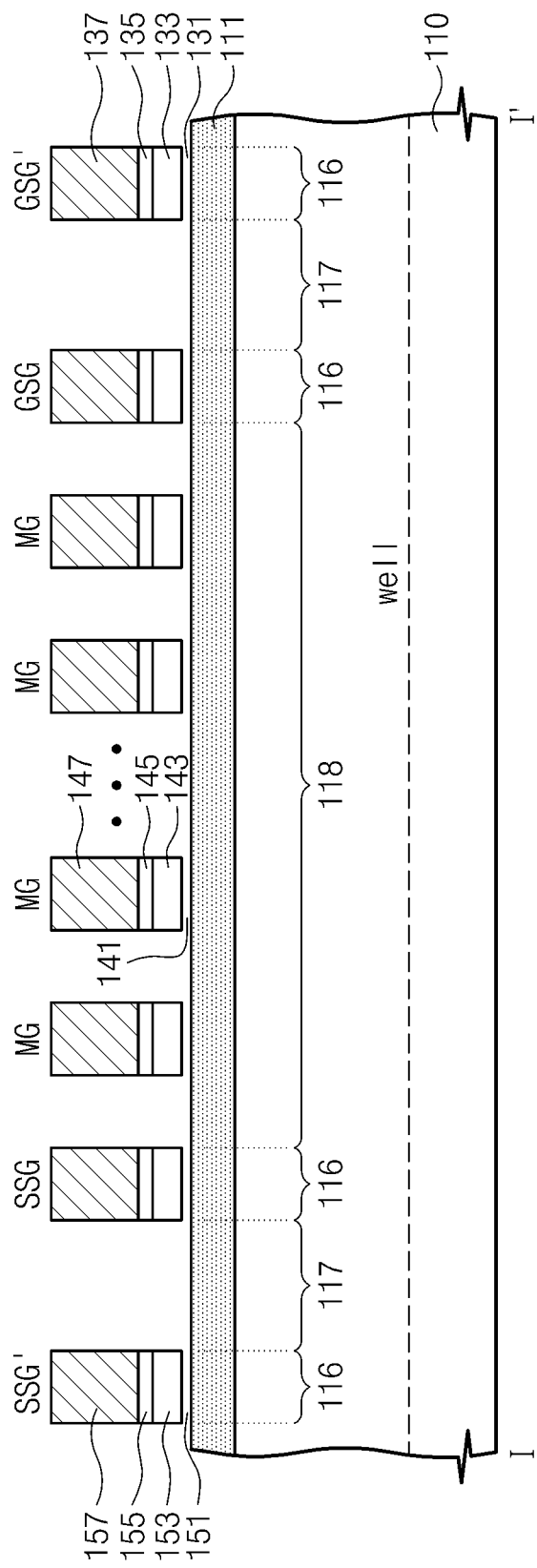

Referring to FIG. 13, gates GSG, SSG, and MG are formed as described above in connection with the previous embodiments. Accordingly, selection channel regions 116, selection impurity regions 117 and a memory cell region 118 are demarcated.

Figure 14:
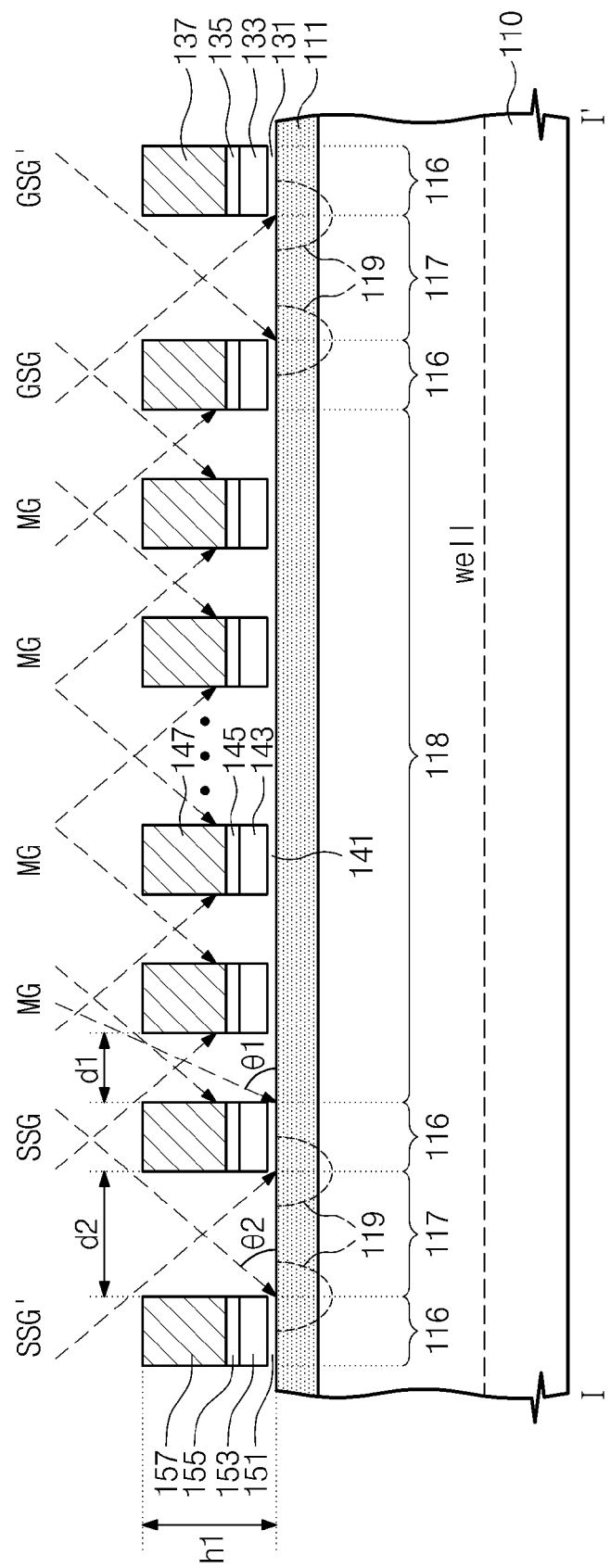

Referring to FIG. 14, a second impurity implanting process is performed as described above in connection with the embodiment of FIGS. 9 and 10. That is, an oblique ion implanting process may be performed using the gates GSG, SSG, and MG as a mask (or an ion implanting mask as disclosed in U.S. Patent Publication No. 2006/0220098 may be used). In any case, the impurities used in the second impurity implanting process have the same conductivity type as those used in the first impurity implanting process.

As a result, impurity-implanted regions 119 are formed at the boundaries between the selection channel regions 116 and the selection impurity regions 117. The impurity-implanted regions 119 have impurities at a concentration higher than the first impurity concentration.

Figure 11:
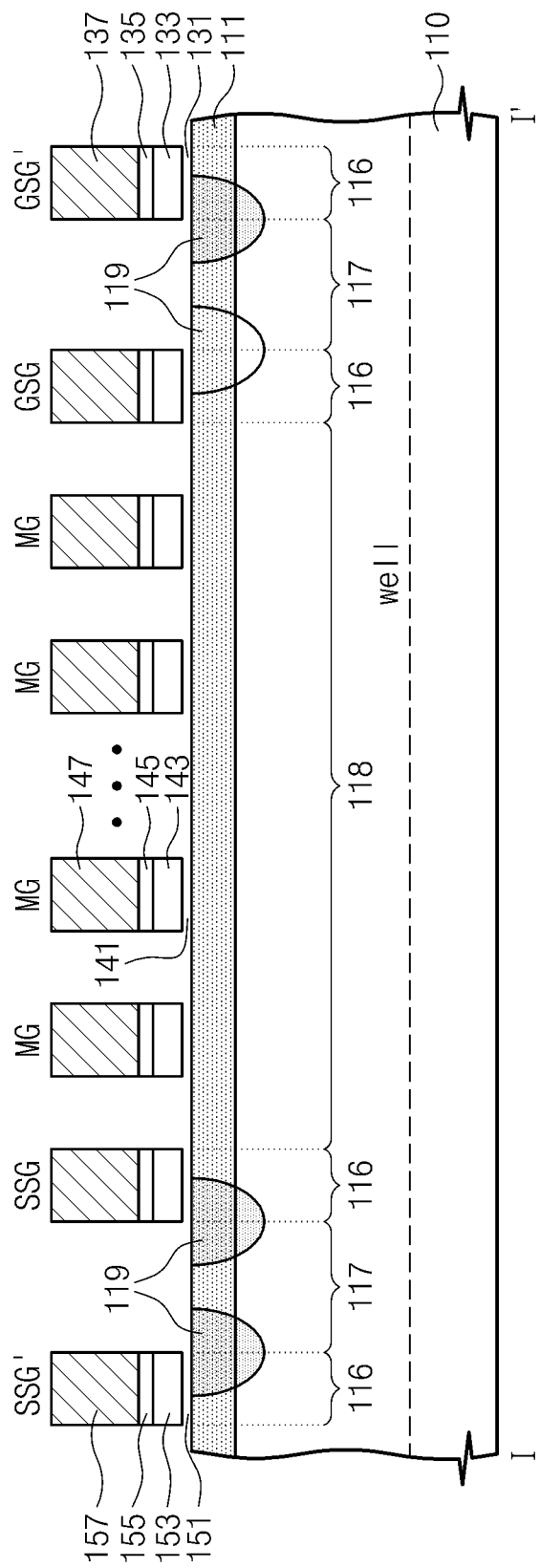
FIGS. 11 through 14 are cross-sectional views illustrating a semiconductor device according to other embodiments of the present inventive concept and a method of manufacturing the same.

Referring to FIG. 11, an annealing process is carried out to expand the impurity-implanted regions 119.

Figure 15:
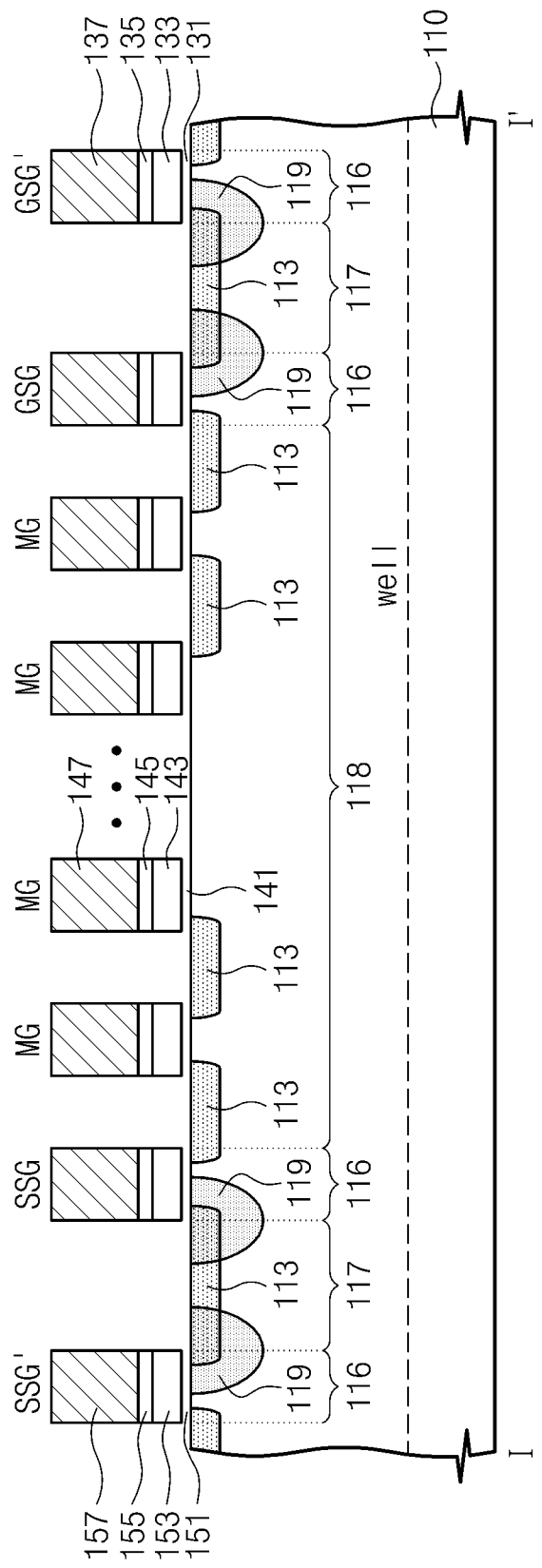
FIGS. 15 through 18 are cross-sectional views illustrating a semiconductor device according to other embodiments of the present inventive concept and a method of manufacturing the same.

Another embodiment of a semiconductor device according to the present inventive concept will now be described below in detail with reference to FIGS. 1 and 15.

A ground selection gate GSG, a string selection gate SSG, and memory gates MG are disposed on an active region ACT of a substrate 110. The gates GSG, SSG, and MG are similar to those of the above-described embodiments. Thus, the substrate 110 has selection channel regions 116 below the ground selection gate GSG and below the string selection gate SSG, respectively, a memory cell region 118 between the ground selection gate GSG and the string selection gate SSG, and selection impurity regions 117 between the adjacent ground selection gates GSG and GSG' and between the adjacent string selection gates SSG and SSG', respectively.

First doping regions 113 having impurities at a first impurity concentration are disposed (in the well) in the substrate 110 between adjacent ones of the gates GSG, SSG, and MG, respectively. The first doping regions 113 may extend to locations below the gates GSG, SSG, and MG, as well. Second doping regions 119 are disposed below each of the confronting sidewalls of the adjacent string selection gates SSG and SSG' and each of the confronting sidewalls of the adjacent ground selection gates GSG and GSG', respectively. The second doping regions 119 have the same conductivity type as the first doping regions 113, but the concentration of impurities in the second doping regions 119 (second impurity concentration) is higher than the concentration of impurities in the first doping regions 113 (first impurity concentration).

Thus, the concentration of impurities in at least a portion of each of the section channel regions 116 is higher than the concentration of impurities in the memory cell region 118.

A method of manufacturing the semiconductor device of FIG. 15 according to the present inventive concept will now be described below in detail with reference to FIG. 1 and FIGS. 15 through 18.

Figure 16:
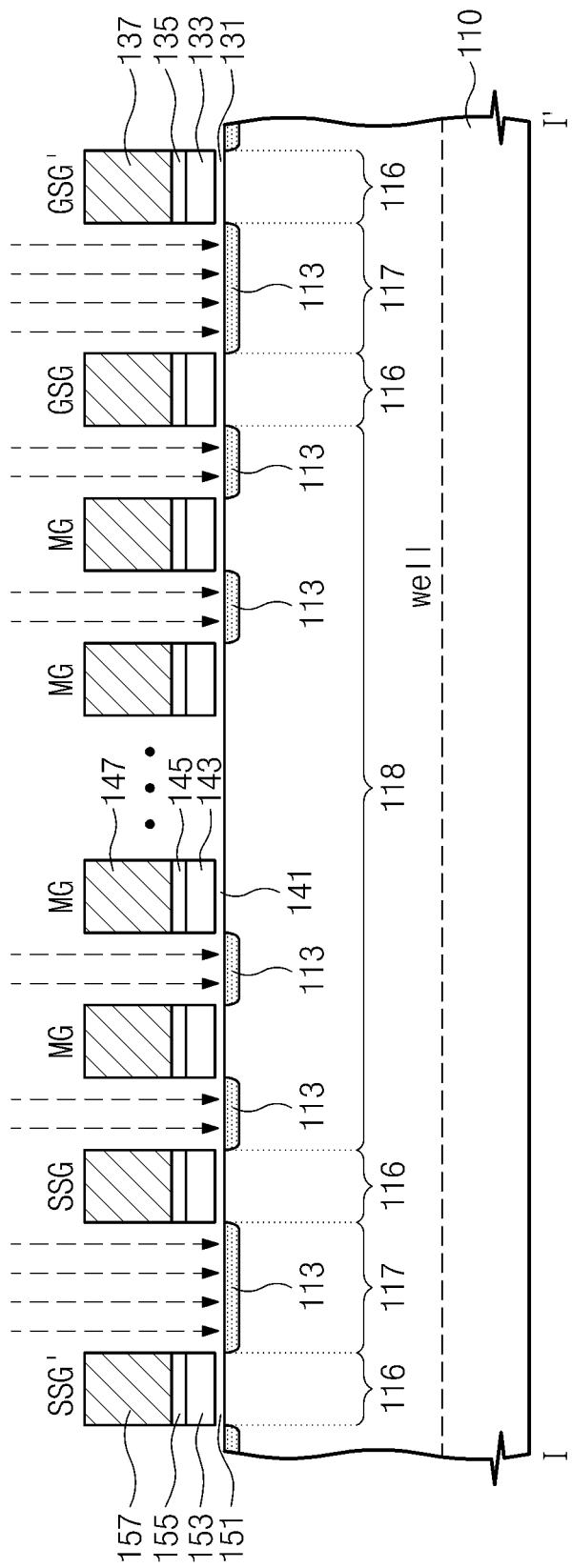

Referring to FIGS. 1 and 16, at least a pair of selection gates including a ground selection gate GSG and a string selection gate SSG, and memory gates MG are formed on an active region of a substrate 110. The gates are formed as described above in connection with the previous embodiments. As was also described above, the gates demarcate selection channel regions 116, selection impurity regions 117 and a memory region 118. Then, a first impurity implanting process is performed using the gates GSG, SSG, and MG as masks. As a result, first doping regions 113 having impurities at a first concentration are formed in the substrate 110 between the gates GSG, SSG, and MG.

Figure 17:
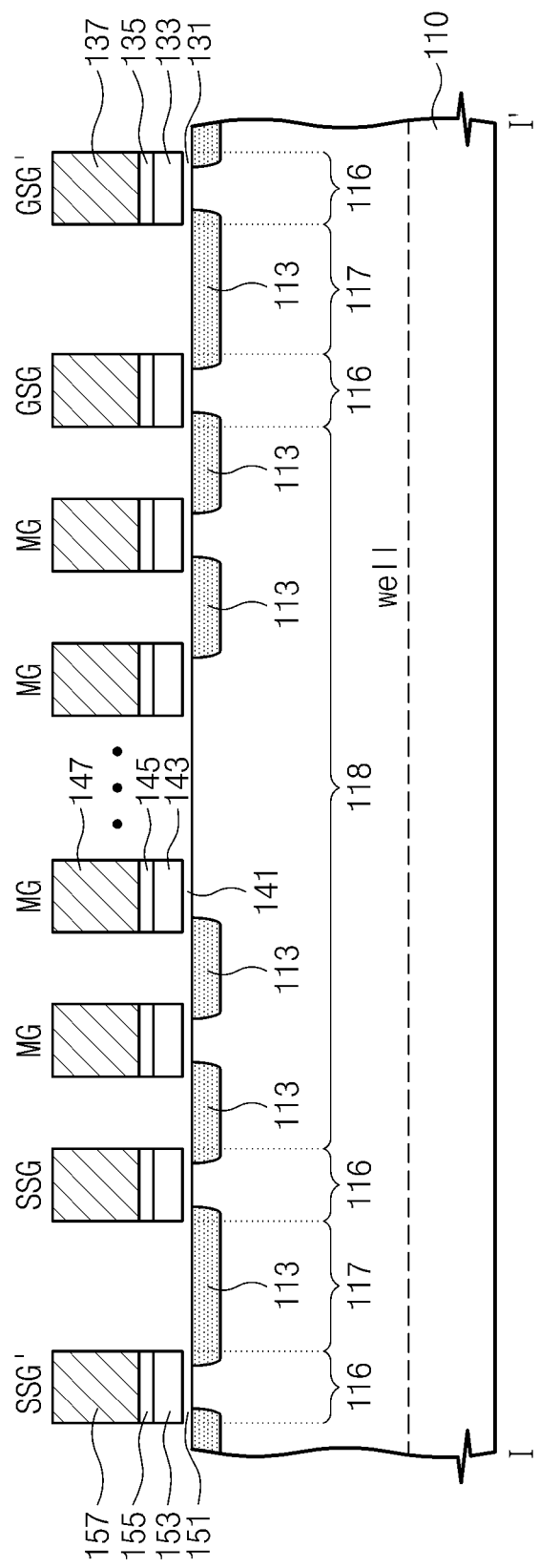

Referring to FIG. 17, an annealing process is carried out to expand the first doping regions 113. Due to the annealing process, the first doping regions 113 occupy portions of the substrate 110 below the memory gates MG and the selection gates GSG and SSG.

Figure 18:
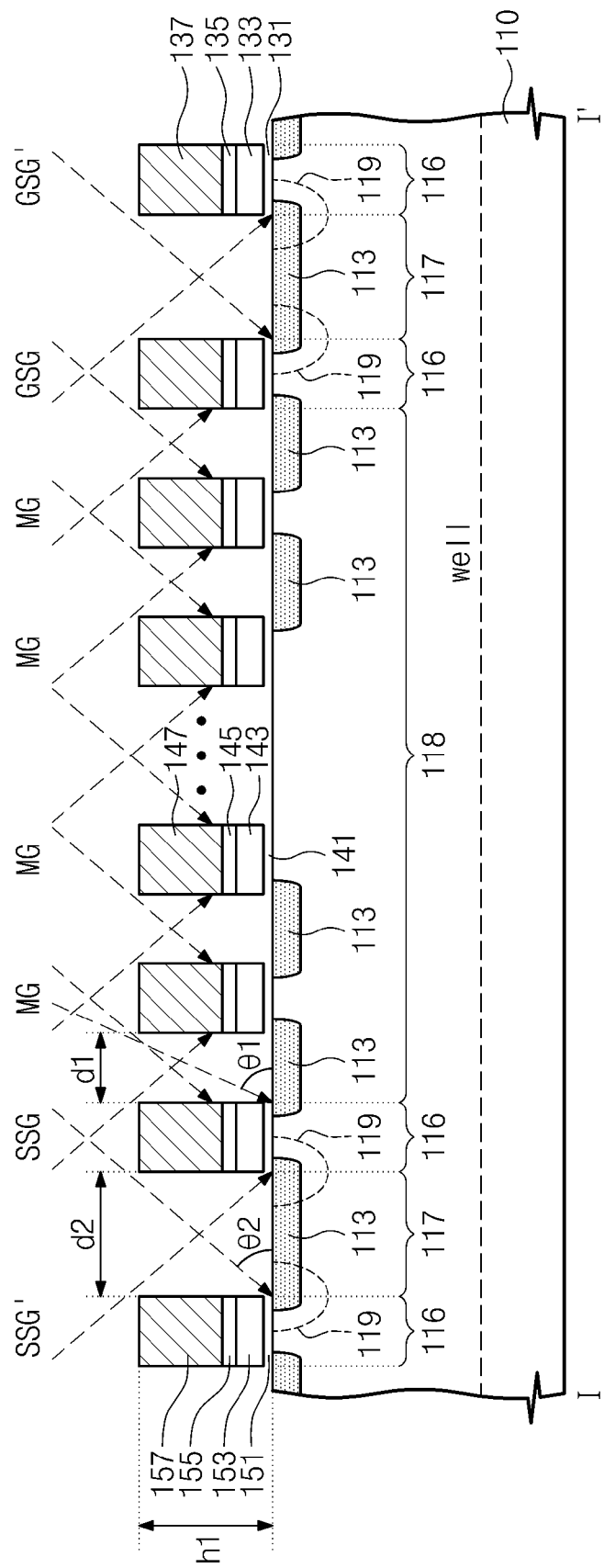

Referring to FIG. 18, a second ion implanting process (an oblique impurity implanting process) is performed using the gates GSG, SSG, and MG as masks. The oblique ion implanting process may be performed in a manner similar to that described above (i.e., using the gates as a mask or using an ion implanting mask to cover the active region between the string selection gate SSG and the ground selection gate GSG). The impurities used in the second ion implanting process have the same conductivity type as those used in the first ion implanting process. As a result, the second doping regions 119 are formed at the boundaries between the selection channel regions 116 and the selection impurity regions 117.

Referring to FIG. 15 again, an annealing process is then performed to expand the second doping regions 119.

Thus, the concentration of impurities in at least a portion of the selection channel region 116 is greater than in the active region below the memory gates MG in the string.

Figure 19:
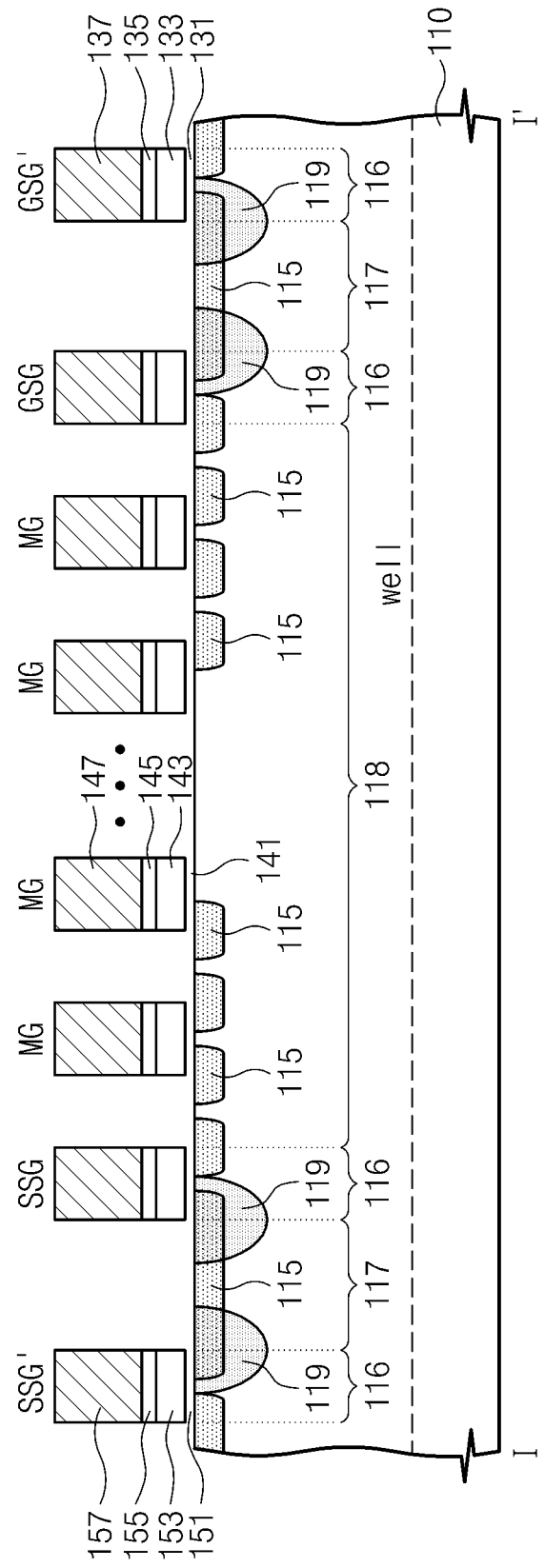
FIGS. 19 through 22 are cross-sectional views illustrating a semiconductor device according to other embodiments of the present inventive concept and a method of manufacturing the same.

Another embodiment of a semiconductor device according to the present inventive concept will now be described below in detail with reference to FIGS. 1 and 19.

A ground selection gate GSG, a string selection gate SSG, and memory gates MG are disposed on an active region ACT of a substrate 110. The gates GSG, SSG, and MG are similar to those of the above-described embodiments. Thus, the substrate 110 has selection channel regions 116 below the ground selection gate GSG and below the string selection gate SSG, respectively, a memory cell region 118 between the ground selection gate GSG and the string selection gate SSG, and selection impurity regions 117 between the adjacent ground selection gates GSG and GSG' and between the adjacent string selection gates SSG and SSG', respectively.

First doping regions 115 are disposed below the sidewalls of the gates GSG, SSG, and MG, respectively. Each of the first doping regions 115 may also extend to a location below a respective one of the gates GSG, SSG, and MG. Second doping regions 119 are disposed below each of the confronting sidewalls of the adjacent string selection gates SSG and SSG' and each of the confronting sidewalls of the adjacent ground selection gates GSG and GSG', respectively. The second doping regions 119 have the same conductivity type as the first doping region 115, but the concentration of impurities in the second doping regions 119 (second impurity concentration) is higher than the concentration of impurities in the first doping regions 115 (first impurity concentration).

Thus, the concentration of impurities in at least a portion of each of the section channel regions 116 is higher than the concentration of impurities in the memory cell region 118.

A method of manufacturing the semiconductor device of FIG. 19 according to the present inventive concept will now be described below in detail with reference to FIG. 1 and FIGS. 19 through 22.

Figure 20:
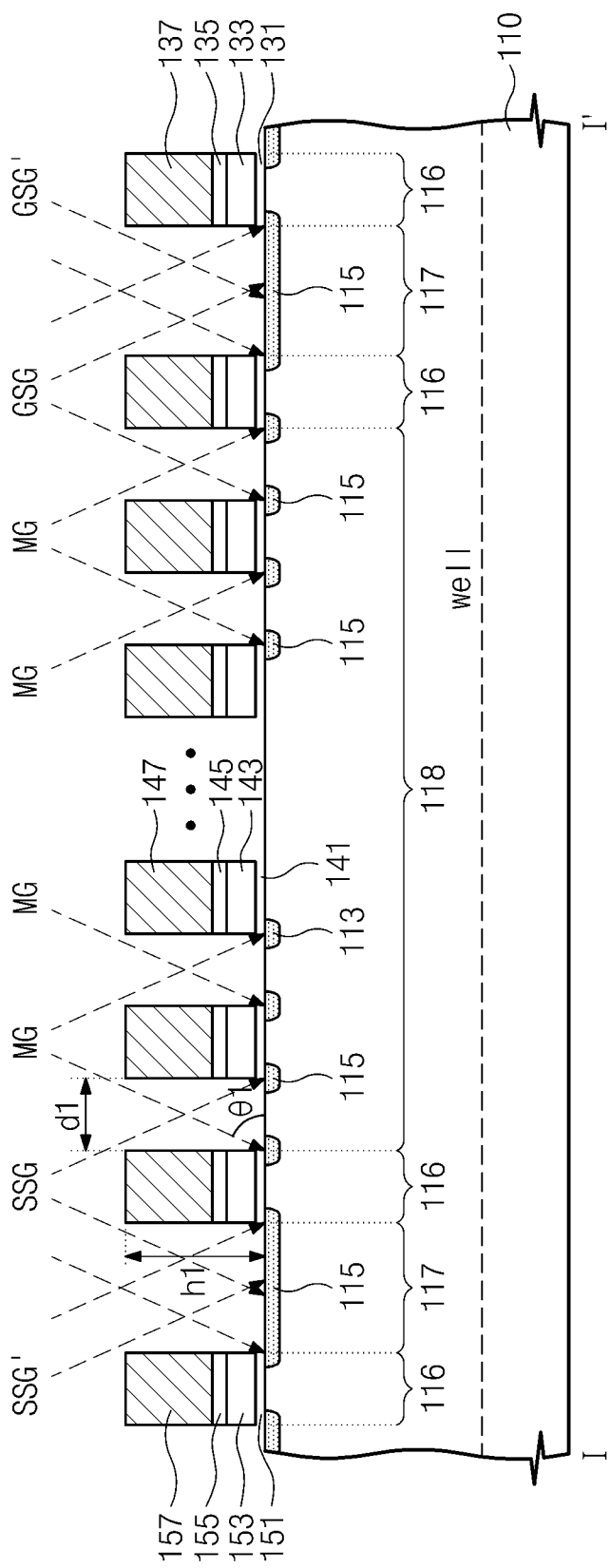

Referring to FIGS. 1 and 20, at least a pair of selection gates including a ground selection gate GSG and a string selection gate SSG, and memory gates MG are formed on an active region of a substrate 110. The gates are formed as described above in connection with the previous embodiments. As was also described above, the gates demarcate selection channel regions 116, selection impurity regions 117 and a memory region 118.

Then, a first impurity implanting process (an oblique impurity implanting process) is performed using gates GSG, SSG, and MG as masks. The implantation angle $\theta i$ of the impurity implanting process is equal to a first angle $\theta 1$ selected based on the distance d1 between a memory gate MG and the selection gate GSG or SSG adjacent thereto and the height h1 of the selection gate GSG or SSG. More specifically, as is clear from the description of previous embodiments and as shown in the figure, the first angle $\theta 1$ may be $\tan^{-1}$ (h1/d1).

Due to the first impurity implanting process, first doping regions 115 are formed below sidewalls of the memory gates MG and sidewalls of the selection gates GSG and SSG, respectively.

Figure 21:
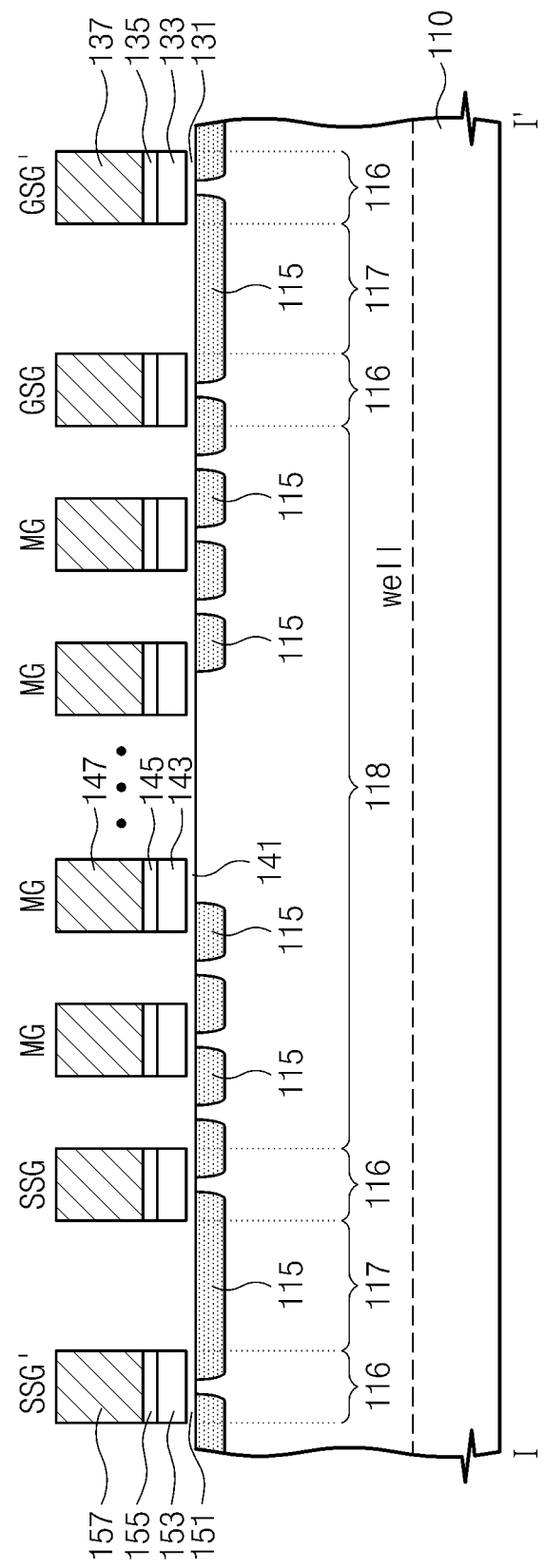

Referring to FIG. 21, an annealing process is performed to expand the first doping regions 115.

Figure 22:
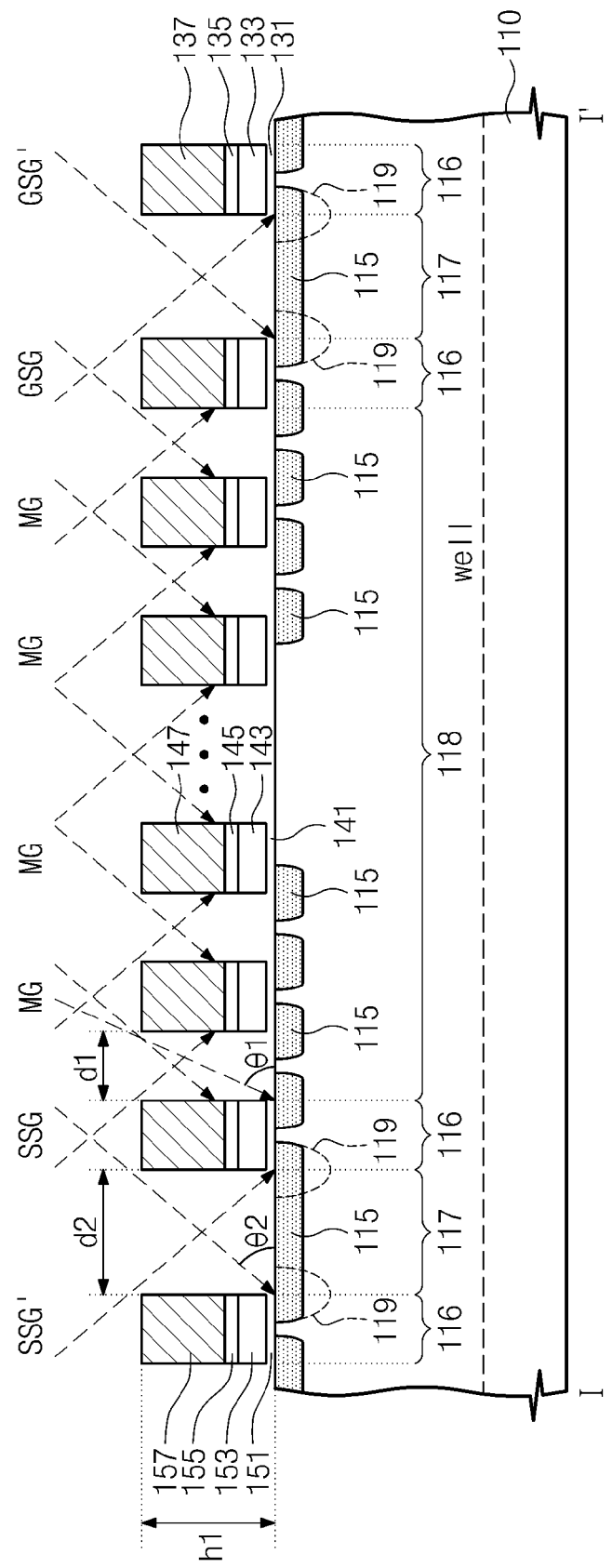

Referring to FIG. 22, a second impurity implanting process (oblique impurity implanting process) is performed using the gates GGS, SSG, and MG as masks. The oblique ion implanting process may be performed at a second angle $\theta 2$ in a manner similar to that described above. The impurities used in the second impurity implanting process may have the same conductivity type as in the first impurity implanting process.

To reiterate, the first angle θ1 may be the minimum angle at which the impurities can be implanted into the active region between the memory gate MG and the adjacent selection gate GSG or SSG. The second angle θ2 is based on the distance d2 between the adjacent string selection gates SSG and SSG' (or the adjacent ground selection gates GSG GSG') and the height h1. In particular, the second angle θ2 is the minimum angle at which the impurities can be implanted into the active region between the adjacent string selection gates SSG and SSG' (or the adjacent ground selection gates GSG GSG').

Alternatively, an impurity implanting mask (not shown) may be formed to cover the substrate 110 between the selection gates GSG and SSG during the ion implantation process. In this case, the active region between the adjacent ground selection gates GSG and GSG' is exposed by the impurity implanting mask. The impurities are implanted into the exposed region of the substrate 110 at an implantation angle θi greater than the second angle θ2 and less than 90 degrees (i.e., θ2<θi<90°). The impurity implanting mask may be a patterned layer of photoresist or spacers formed on sidewalls of the gates GSG, SSG, and MG as disclosed in U.S. Patent Publication No. 2006/0220098.

As a result, the second doping regions 119 are formed at the boundaries between the selection channel regions 116 and the selection impurity regions 117.

An annealing process is then performed to expand the second doping regions 119 to locations below the gates GSG, SSG, and MG.

Thus, the concentration of impurities in at least a portion of each of the section channel regions 116 is higher than the concentration of impurities in the memory cell region 118.

Figure 23:
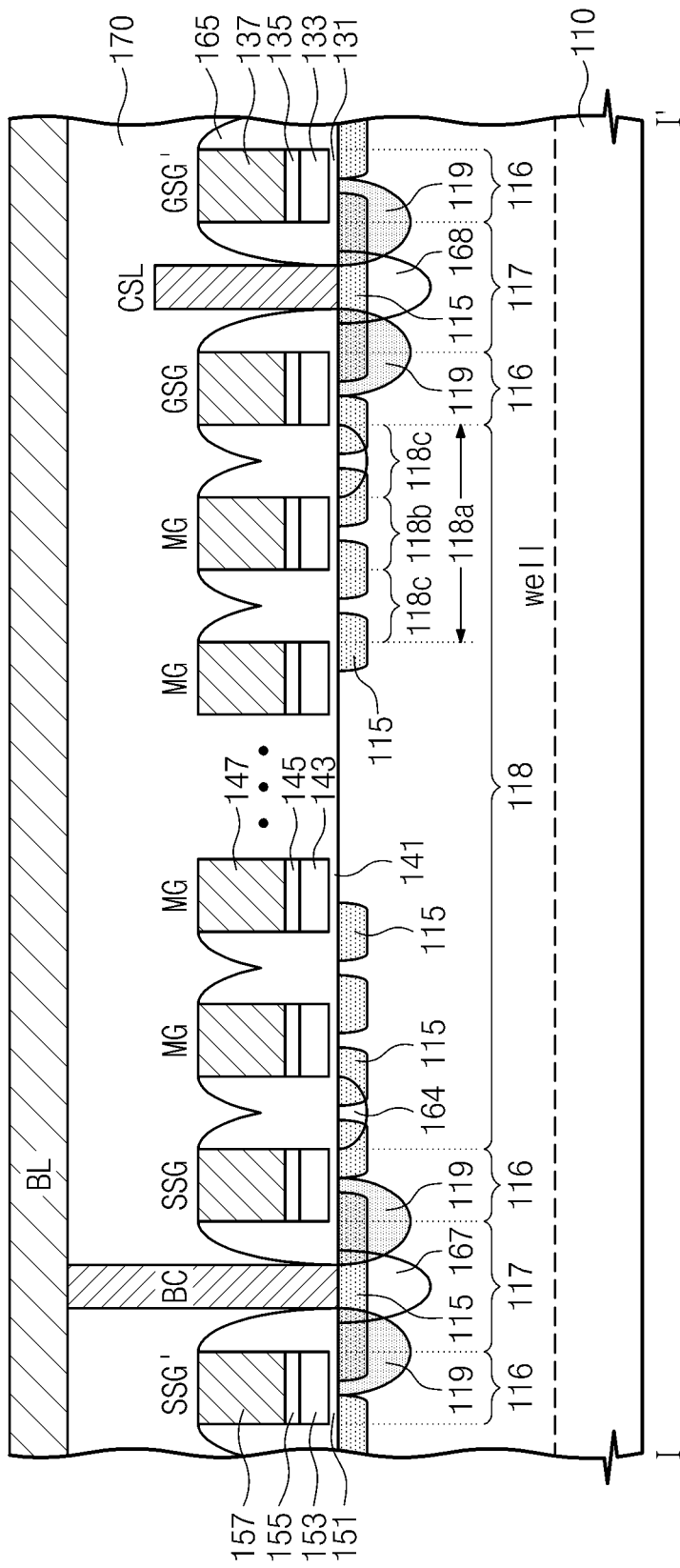
FIGS. 23 through 25 are cross-sectional views illustrating a semiconductor device according other embodiments of the present inventive concept and a method of manufacturing the same.

Another embodiment of a semiconductor device according to the present inventive concept will now be described below in detail with reference to FIGS. 1 and 23.

A ground selection gate GSG, a string selection gate SSG, and memory gates MG are disposed on an active region ACT of a substrate 110. The gates GSG, SSG, and MG are similar to those of the above-described embodiments. Thus, the substrate 110 has selection channel regions 116 below the ground selection gate GSG and below the string selection gate SSG, respectively, a memory cell region 118 between the ground selection gate GSG and the string selection gate SSG, and selection impurity regions 117 between the adjacent ground selection gates GSG and GSG' and between the adjacent string selection gates SSG and SSG', respectively.

First doping regions 115 are disposed below the sidewalls of the gates GSG, SSG, and MG, respectively. Each of the first doping regions 115 may also extend to a location below a respective one of the gates GSG, SSG, and MG. Second doping regions 119 are disposed below each of the confronting sidewalls of the adjacent string selection gates SSG and SSG' and each of the confronting sidewalls of the adjacent ground selection gates GSG and GSG', respectively. The second doping regions 119 have the same conductivity type as the first doping region 115, but the concentration of impurities in the second doping regions 119 (second impurity concentration) is higher than the concentration of impurities in the first doping regions 115 (first impurity concentration).

Thus, the concentration of impurities in at least a portion of each of the section channel regions 116 is higher than the concentration of impurities in the memory cell region 118.

There is also thus provided a unit memory cell region 118a that includes a unit memory channel sub-region 118b disposed below one memory gate MG and unit memory impurity sub-regions 118c at opposite sides of the memory gate MG.

A respective third doped region 164 extends between each of the selection gates SSG and GSG and the memory gate MG adjacent thereto. The third doped regions 164 are of a different conductivity type different from that of the first doping regions 115. Thus, in at least one unit memory cell region 118a the unit memory channel sub-region 118b is of a conductivity type different from that of the unit memory impurity regions 118c.

Spacers 165 are disposed on sidewalls of the gates SSG, GSG, and MG. The spacers 165 may fill the spaces between the memory gates MG, but expose portions of the active region between the adjacent selection gates. A bitline junction impurity region 167 extends in the substrate 110 between the string selection gates SSG and SSG', and a common source region 168 extends in the substrate 110 between the ground selection gates GSG and GSG'. An interlayer dielectric 170 is disposed on the substrate 110 over the gates SSG, GSG, and MG. A bitline contact BC and a common source line CSL extend through the interlayer dielectric 170 into contact with the bitline junction impurity region 167 and the common source region 168, respectively. A bit-line BL extends along the interlayer dielectric 170 and intersects and is connected to the bitline contact BC.

A method of manufacturing the semiconductor device of FIG. 23 according the present inventive concept will now be described below in detail with reference to FIG. 1 and FIGS. 23 through 25.

Figure 24:
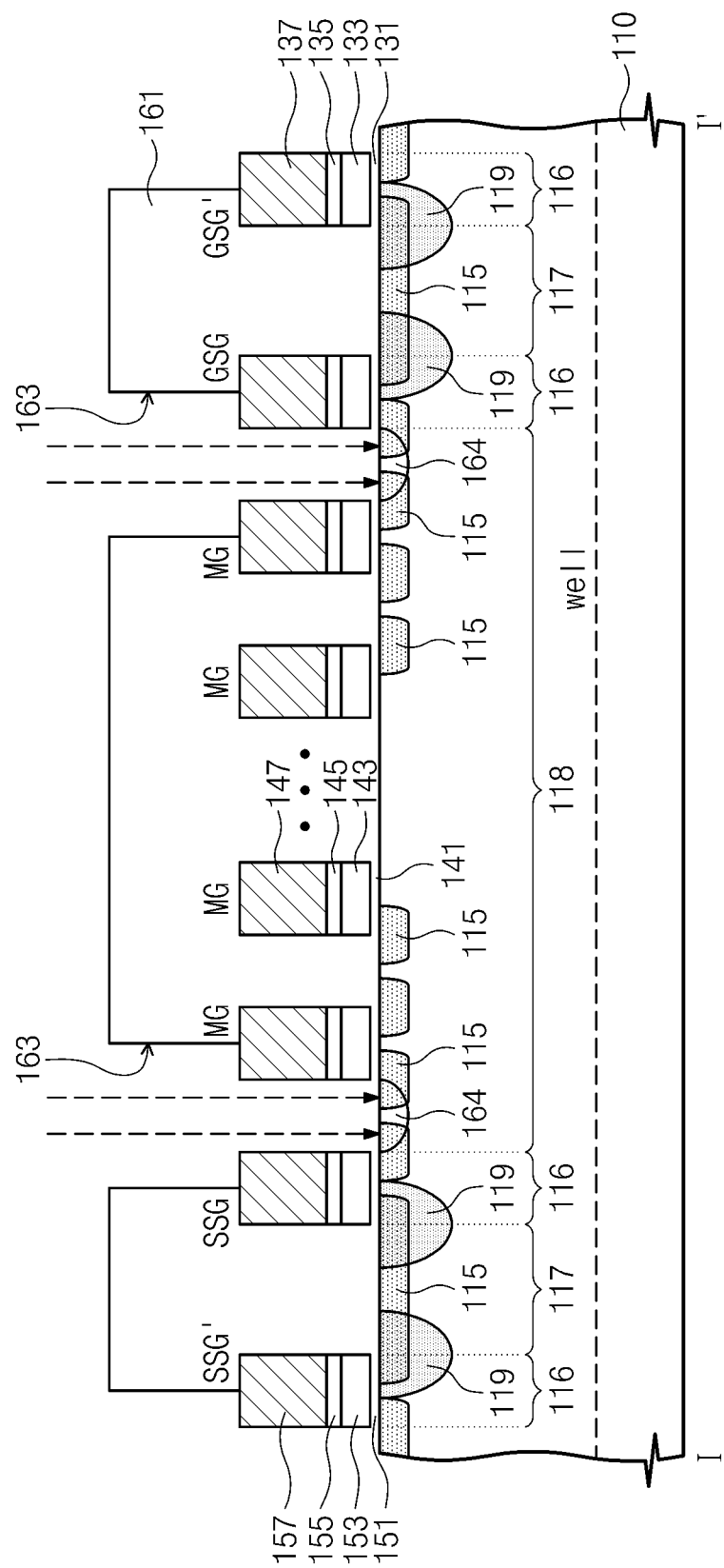

Referring to FIGS. 1 and 24, a structure is formed as described above in connection with FIGS. 20-22. An impurity implanting mask 161 is formed on the structure (shown in FIG. 19). The impurity implanting mask 161 has openings 163 that expose regions of the substrate 110 to be implanted with impurities. More specifically, the impurity implanting mask 161 exposes respective portions of the active region between each selection gate SSG and GSG and the memory gate MG adjacent thereto. The impurity implanting mask 161 may be formed of a layer of photoresist, silicon nitride or silicon oxide.

An impurity implanting process is then performed using the impurity implanting mask 161. As a result, third doped regions 164 are formed. The impurities used are such that the third doped regions 164 are of a conductivity type different from that of the first doping regions 115. For example, the third doped regions 164 may contain N-type impurities while the first doping region 115 may contain P-type impurities. The impurity implanting mask 161 is then removed.

Figure 25:
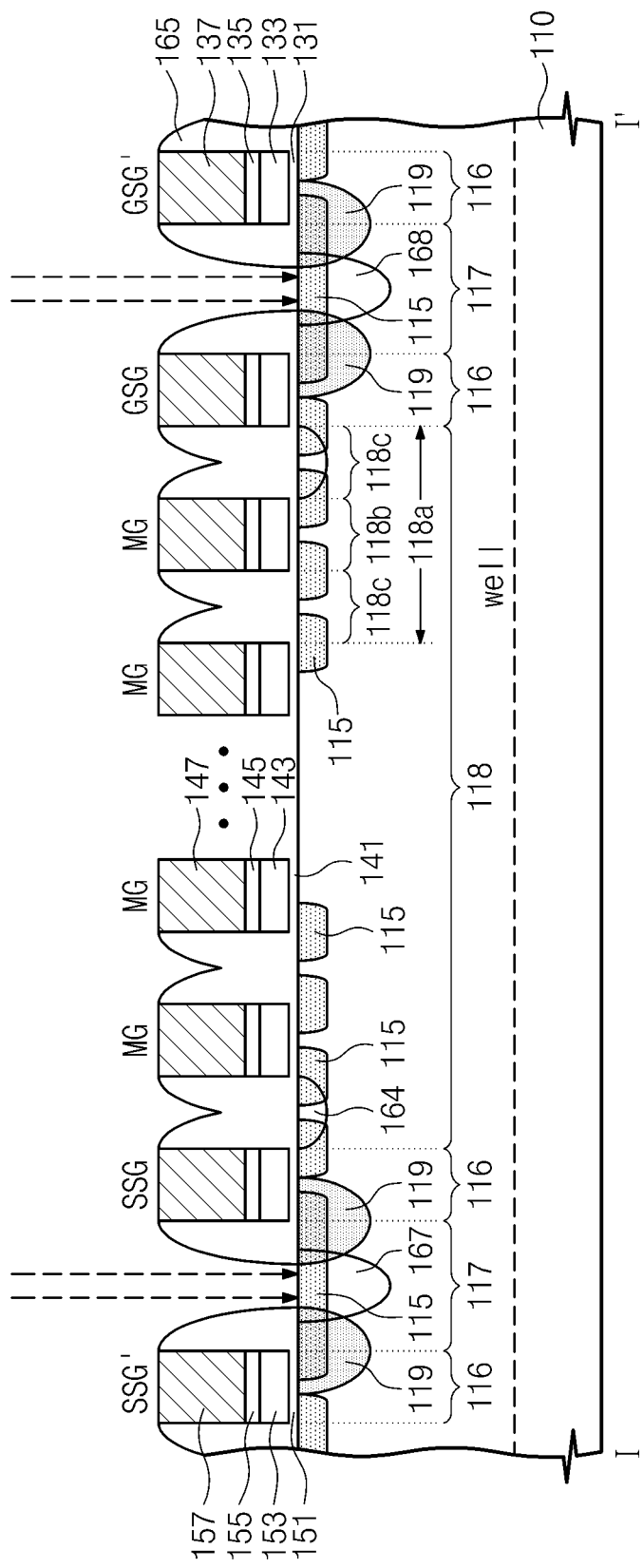

Referring to FIG. 25, spacers 165 are formed on sidewalls of the gates SSG, GSG, and MG. Using the spacers 165 as masks, are implanted into the substrate 110 between the string selection gates SSG and SSG' and between the ground selection gates GSG and GSG' to form a bitline junction impurity region 167 and a common source region 168. The bitline junction impurity region 167 and the common source region 168 have the same conductivity type as the third doped regions 164.

Referring to FIG. 23 again, the interlayer dielectric 170 is then formed on the gates SSG, GSG, and MG. A bitline contact BC is formed in the interlayer dielectric 170 between the string selection gates SSG and SSG' as electrically conductively connected to the a bitline junction impurity region 167, and a common source line CSL is formed interlayer dielectric 170 between the ground selection gates GSG and GSG' as electrically conductively connected to the common source region 168. A bit-line BL is then formed on the interlayer dielectric 170 as electrically connected to the bitline contact BC.

Figure 26:
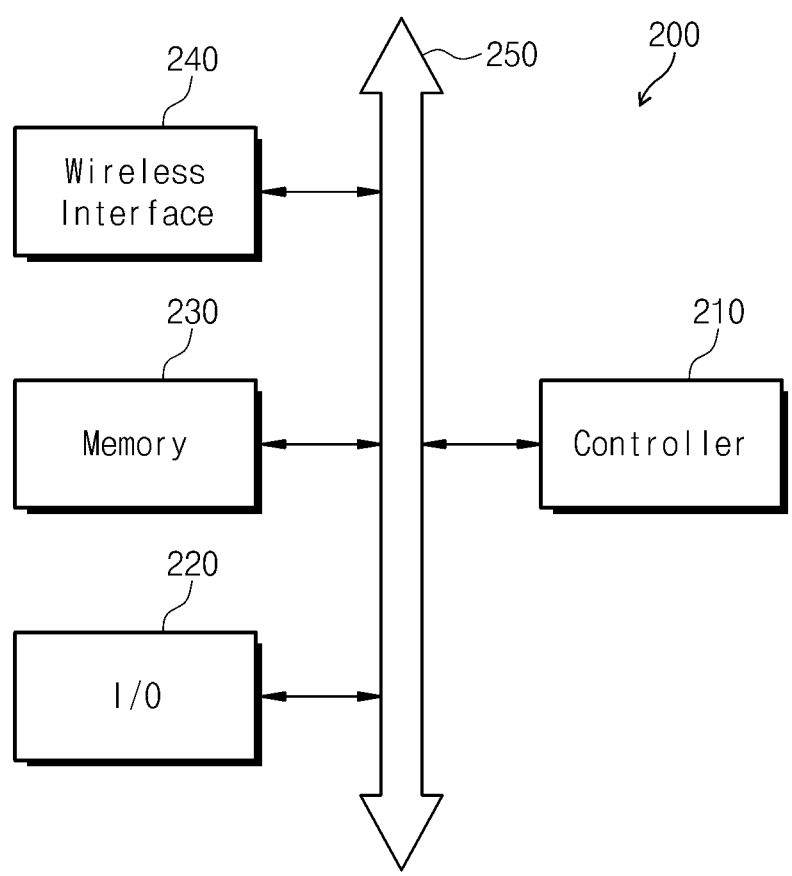
FIG. 26 is a block diagram of an electronic system including a semiconductor device according to some embodiments of the present invention.

An electronic system 200 including a semiconductor device according to the present inventive concept will now be described below in detail with reference to FIG. 26. The electronic system 200 may be used in wireless communication devices such as, for example, personal digital assistants (PDA), laptop computers, portable computers, web tablets, cordless phones, mobile phones, digital music players, and all other devices capable of sending and/or receiving data in a wireless environment.

The electronic system 200 includes a controller 210, an input/output device (I/O) 220 (e.g., a keypad, a keyboard, a display or the like), a memory 230, and a wireless interface 240, which are connected through a bus 250. The controller 210 includes at least one microprocessor, a digital signal processor, a microcontroller or the like. The memory 230 is used to store, for example, commands executed by the controller 210. Also the memory 230 may be used to store user data. The memory 230 includes a semiconductor device according to the present invention.

The wireless interface 240 transmits and receives data into and from a wireless communication network that is communicating through an RF signal. For example, the wireless interface 240 includes an antenna, a wireless transceiver or the like.

The electronic system 200 may be used in a communication interface protocol of a third generation communication system such as CDMA, GSM, NADC, E-TDMA, WCDAM, CDMA2000 or the like.

Figure 27:
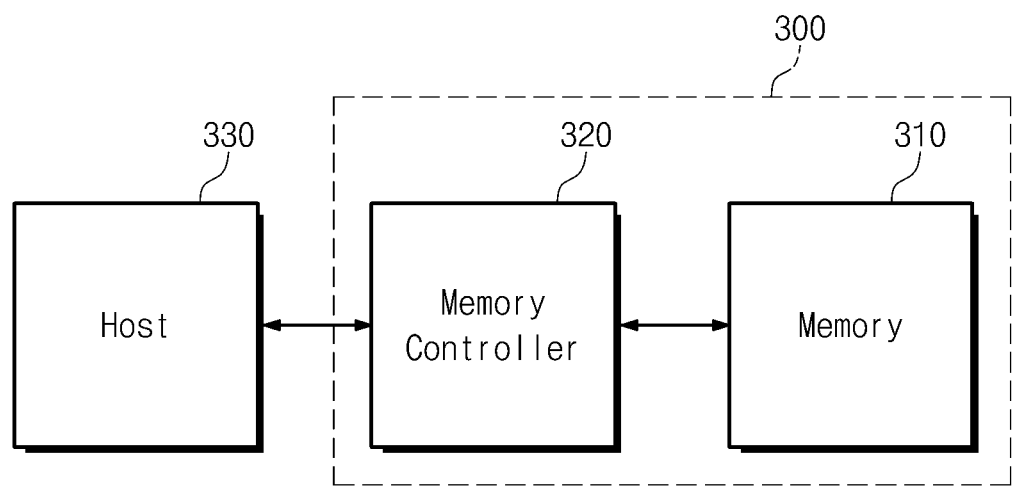
FIG. 27 is a block diagram of a memory system including a semiconductor device according to some embodiments of the present invention.

A memory system 300 including a semiconductor device according to the present inventive concept will now be described below in detail with reference to FIG. 27. The memory system 300 includes a memory device 310 for storing large amounts of data and a memory controller 320. The memory controller 320 controls the memory device 310 to read/write stored data from/into the memory device 310 in response to read/write request of a host. The memory controller 320 may constitute an address mapping table for mapping an address provided from the host 330 (a mobile device or a computer system) to a physical address of the memory device 310.

As described above, a semiconductor device according to the present inventive concept includes selection and memory transistors, wherein the threshold voltage of the selection transistors is higher than that of a memory transistor. To this end, the channel regions of the selection transistors have a higher concentration of impurities than the channel region of the memory transistor. When the present inventive concept is applied to a flash memory device, leakage current of a string is suppressed to enhance programming reliability of the semiconductor device.

Although the present inventive concept has been described in connection with the embodiment of the present inventive concept illustrated in the accompanying drawings, it is not limited thereto. It will be apparent to those skilled in the art that various substitutions, modifications and changes may be made without departing from the scope and spirit of the inventive concept.

What is claimed is:

1. A semiconductor device comprising:
a substrate having an active region;
plurality of memory gates disposed on the active region of the substrate;
a ground selection gate located on the active region at a first side of the plurality of memory gates,
the ground selection gate having an inner side facing towards one of the plurality of memory gates, and an outer side opposite the inner side thereof;
a string selection gate located on the active region at a second side of the plurality of memory gates opposite the first side,
the string selection gate having an inner side facing towards another of the plurality of memory gates, and an outer side opposite the inner side thereof;
a plurality of first doping regions occupying portions of the active region between the respective memory gates, occupying a portion of the active region between said another of the memory gates and the string selection gate, occupying a portion of the active region between said one of the memory gates and the ground selection gate, occupying a first portion of the active region extending in a first direction away from the outer side of the string selection gate, and occupying a second portion of the active region extending in a second direction opposite the first direction away from the outer side of the ground selection gate; and
second doping regions each having impurities of a first conductivity type, a first one of the second doping regions extending in the active region in the first direction from a location directly below the string selection gate beyond the outer side of the string selection gate, and a second one of the second doping regions extending in the active region in the second direction from a location directly below the ground selection gate beyond the outer side of the ground selection gate,
wherein all of the first doping regions have impurities of the first conductivity type,
the second doping regions are deeper than the first doping regions,
the second doping regions have a higher concentration of impurities than the first doping regions that occupy the portions of the active region between the respective memory gates,
the first doping region that occupies the first portion of the active region extends in the first direction to a location further from the outer side of the string selection gate than the first one of the second doping regions,
the first doping region that occupies the second portion of the active region extends in the second direction to a location further from the outer side of the ground selection gate than the second one of the second doping regions, and
the portions of the active region between the memory gates are devoid of impurities of a different conductivity type from the first conductivity type.

2. The semiconductor device of claim 1, wherein at least one of the memory gates comprises a first memory insulating layer, a charge storage layer formed on the first memory insulating layer, a second memory insulating layer formed on the charge storage layer, and a conductive layer formed on the second memory insulating layer.

3. The semiconductor device of claim 2, wherein the charge storage layer is a floating-type storage layer or a trap-type storage layer.

4. The semiconductor device of claim 1, wherein the second doping regions are formed by an oblique impurity implanting process.

5. The semiconductor device of claim 1, further comprising another string selection gate located on the active region adjacent to the string selection gate, and another ground selection gate located on the active region adjacent to the ground selection gate,
wherein said first portion of the active region is located between the string selection gate and the another string selection gate, and
said second portion of the active region is located between the ground selection gate and the second ground selection gate.

6. The semiconductor device of claim 5, wherein the memory gates are separated from each other by a first distance, and the string selection gate and the another string selection gate are separated from each other by a second distance larger than the first distance.

7. The semiconductor device of claim 6, wherein the second distance corresponds to an implantation angle of an oblique impurity implantation process used to form the second doping regions.

8. The semiconductor device of claim 1,
wherein the first one of the second doping regions has a portion thereof located directly below the center of the string selection gate midway between the inner and outer sides thereof, and the second one of the second doping regions has a portion thereof located directly below the center of the ground selection gate midway between the inner and outer sides thereof.

9. The semiconductor device of claim 1, wherein each of the first doping regions, that occupy the portions of the active region between the respective memory gates, spans adjacent ones of a respective pair of the memory gates so as to connect regions of the substrate located directly below the adjacent ones of the memory gates.

10. The semiconductor device of claim 1, wherein each of the first doping regions has the same concentration of impurities of the first conductivity type as the others of the first doping regions.

11. A semiconductor device comprising:
a substrate having an active region;
a group of memory gates disposed on the active region of the substrate such that first and second ones of the memory gates constitute opposite sides of the group, respectively;
first and second ground selection gates disposed on the active region adjacent the first one of the memory gates,
the first ground selection gate being disposed closer to the first one of the memory gates than the second ground selection gate;
first and second string selection gates disposed on the active region at a adjacent the second one of the memory gates,
the first string selection gate being disposed closer to the second one of the memory gates than the second string selection gate;
a plurality of first doping regions occupying portions of the active region between the respective memory gates, occupying a portion of the active region between the first one of the memory gates and the first ground selection gate, occupying a portion of the active region extending between the second one of the memory gates and the first string selection gate, occupying a portion of the active region between the first and second string selection gates, occupying a portion of the active region between the first and second ground selection gates
all of the first doping regions having impurities of a first conductivity type, all of the first doping regions extending to the same depth in the active region of the substrate, and each of the first doping regions having the same concentration of impurities of the first conductivity type as the others of the first doping regions;
a first pair of spaced apart second doping regions, each of the second doping regions of the first pair extending into the active region between the first and second ground selection gates from a location directly below a respective one of the first and second ground selection gates, and
a second pair of spaced apart second doping regions, each of the second doping regions of the second pair extending into the active region between the first and second string selection gates from a location directly below a respective one of the first and second string selection gates, wherein each of the second doping regions has a portion thereof located directly below the center of a respective one of the selection gates midway between inner and outer sides thereof
all of the second doping regions having impurities of the first conductivity type, all of the second doping regions extending to the same depth in the active region of the substrate, and each of the second doping regions having the same concentration of impurities of the first conductivity type as the others of the second doping regions, and
wherein the second doping regions are deeper than the first doping regions,
the second doping regions have a higher concentration of impurities of the first conductivity type than the first doping regions, and
the portions of the active region between the memory gates, between the first ground selection gate and the first one of the memory gates, and between the first string selection gate and the second one of the memory gates are devoid of impurities of a conductivity type different from that of the first conductivity type.

12. The semiconductor device of claim 11, wherein at least one of the memory gates comprises a first memory insulating layer, a charge storage layer formed on the first memory insulating layer, a second memory insulating layer formed on the charge storage layer, and a conductive layer formed on the second memory insulating layer.

13. The semiconductor device of claim 12, wherein the charge storage layer is a floating-type storage layer or a trap-type storage layer.

14. The semiconductor device of claim 11, wherein the memory gates are separated from each other by a first distance, and the first and second string selection gates are separated from each other by a second distance larger than the first distance.

15. The semiconductor device of claim 11, wherein each of the first doping regions, that occupy the portions of the active region between the respective memory gates, spans adjacent ones of a respective pair of the memory gates.

* * * * *